United States Patent [19]
Gilbert

[11] Patent Number: 5,714,911
[45] Date of Patent: *Feb. 3, 1998

[54] QUADRATURE OSCILLATOR HAVING AMPLITUDE CONTROL MEANS BASED ON A TRIGONOMETRIC IDENTITY

[75] Inventor: Barrie Gilbert, Portland, Oreg.

[73] Assignee: Analog Devices, Norwood, Mass.

[*] Notice: The term of this patent shall not extend beyond the expiration date of Pat. No. 5,489,878.

[21] Appl. No.: 595,882

[22] Filed: Feb. 6, 1996

Related U.S. Application Data

[63] Continuation-in-part of Ser. No. 344,361, Nov. 23, 1994, Pat. No. 5,489,878.

[51] Int. Cl.⁶ .................. H03L 5/00; H03B 5/02; H03B 5/06
[52] U.S. Cl. .................. 331/57; 331/109; 331/115; 331/135; 331/177 R; 331/183
[58] Field of Search .................. 331/57, 109, 115, 331/135, 136, 177 R, 182, 183

[56] References Cited

U.S. PATENT DOCUMENTS

| | | | |
|---|---|---|---|
| 4,973,920 | 11/1990 | Kasperkovitz | 331/45 |
| 5,172,076 | 12/1992 | Brown | 331/57 |

OTHER PUBLICATIONS

"Analogue IC design: the current-mode approach," Chapter 2 entitled Current-mode Circuits From A Translinear Viewpoint: A Tutorial by Barrie Gilbert, Peter Peregrinus Ltd., pp.10–91, 1990.

"Nonlinear Circuits Handbook", Analog Devices, pp. 78–81, 1976.

*Primary Examiner*—Siegfried H. Grimm
*Attorney, Agent, or Firm*—Marger, Johnson, McCollom & Stolowitz, P.C.

[57] ABSTRACT

A quadrature oscillator includes an amplitude control circuit that is based upon the trigonometric identity $\sin^2\omega t + \cos^2\omega t = 1$. The amplitude control circuit, referred to as a Pythagorator, includes two squaring circuits. Each squaring circuit receives a respective quadrature oscillator signal and squares it. The outputs of the two squaring circuits are joined together so as to sum the outputs of the two squaring circuits to produce a sum of squares signal. This signal, a current in the preferred embodiment, is provided to damping diodes coupled to the outputs of the quadrature oscillator. The damping diodes produce a shunt positive resistance at the outputs of the quadrature oscillator in response to this current that has the effect of cancelling the shunt negative resistance of the regenerative elements of the oscillator thereby establishing the amplitude of the quadrature oscillator signals at a desired amplitude.

38 Claims, 15 Drawing Sheets

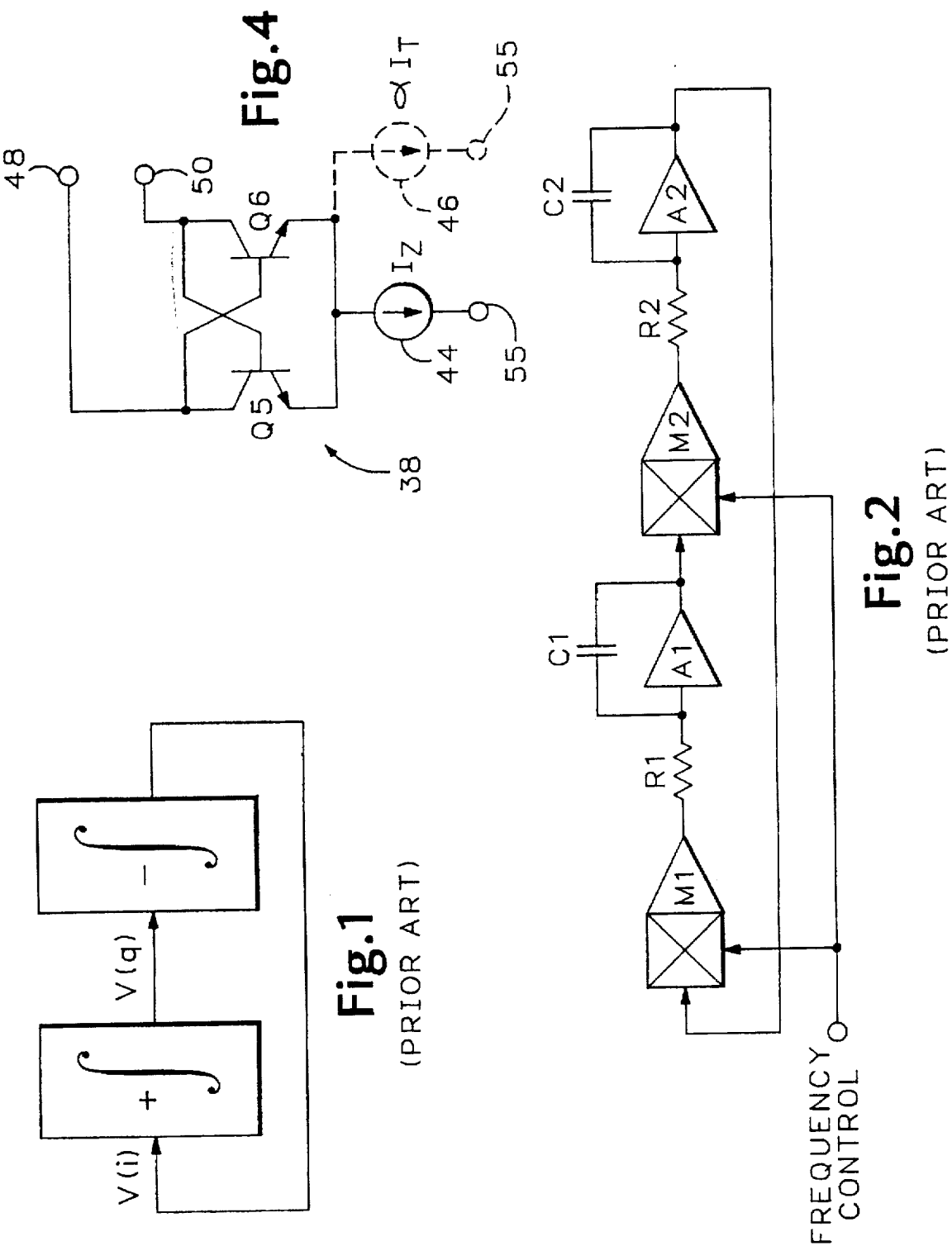

5,714,911

1

QUADRATURE OSCILLATOR HAVING AMPLITUDE CONTROL MEANS BASED ON A TRIGONOMETRIC IDENTITY

This invention is a continuation-in-part of application Ser. No. 08/344,361, filed Nov. 23, 1994, which issued as U.S. Pat. No. 5,489,878 on Feb. 6, 1996.

BACKGROUND OF THE INVENTION

This invention relates generally to communication systems and more particularly to oscillators therefor.

Oscillators are of fundamental importance in communication systems. These systems have exacting requirements for oscillators. These requirements include: spectral purity, including short term frequency stability, often expressed in terms of phase noise, and harmonic distortion (deviation from ideal waveform); ease of frequency control (including, in some instances, wide tuning range); and low power consumption. In addition, ease of integration in monolithic form is often an additional requirement since most commercial communication systems must now be manufacturable at a low cost.

Low phase noise is especially critical in communication systems. For example, consider an oscillator operating at 1 GHz driving a mixer in a narrow-band FM radio application. If the short-term frequency varies in a random fashion, with a normal standard deviation of only 10 parts per million, the resulting base band signal will have a noisy frequency modulation of 10 kHz RMS, which may be two to three times the variation due to the signal modulation, making it useless. Accordingly, the phase noise of a high frequency oscillator in a communication system must be extremely low.

One class of oscillators that has been used in communication systems are those depending on time-constants formed by capacitors (C) and resistors (R). Within this category are so-called relaxation oscillators (multivibrators), which use at least one capacitor, and filter-based CR oscillators, which require at least two capacitors. One class of such oscillators achieve an oscillatory condition by connecting two nominally ideal integrator stages in a loop including a sign change. A model of this type of oscillator is shown in FIG. 1.

The model in FIG. 1 includes a non-inverting integrator followed by an inverting integrator with the output of the inverting integrator connected to the input of the non-inverting integrator to form a closed loop. Because the non-inverting integrator introduces a constant phase lag of 90 degrees, the output signal of the non-inverting integrator V(q) has a constant phase lag of 90 degrees relative to the "in-phase" input signal v(i). As such, the output signal is said to be "in quadrature" with the input signal. Accordingly, oscillators that can be modeled as shown in FIG. 1 are called quadrature oscillators.

A popular implementation of the oscillator modeled in FIG. 1 is shown in FIG. 2. The oscillator of FIG. 2 includes two op-amps A1 and A2, each configured as an integrator by having a capacitor coupled between the inverting input and the output of the associated op-amp. The oscillator of FIG. 2 also includes two multiplier circuits M1 and M2 that are used to tune the oscillator to a desired frequency of oscillation. The multipliers effectively vary the time constant associated with each integrator stage responsive to a frequency control signal applied thereto. Implementation shown in FIG. 2 is referred to as a voltage-controllable state-variable oscillator.

2

The voltage controllable state-variable oscillator of FIG. 2 is fundamentally unsatisfactory for high frequency, low phase noise applications. One reason for this is that the op-amp itself is fundamentally an integrator, even without the addition of the external capacitor. Indeed, op-amps are consciously designed to be integrators, though generally not specified in this way, or suited for direct use as such. This behavior is effected through the use of an internal resistor (which sets the gm of the op-amp input stage) and an internal capacitor, which form a dominant pole in the op-amp. This pole introduces an additional 90 degrees of phase lag in the integrator circuit at high frequencies. Connected as an active (feedback) integrator, the dominant pole produces a change in the amplitude slope of the integrator at a critical frequency, which may limit the state-variable oscillator to use at relatively low frequencies. Moreover, the finite bandwidth of the multipliers impose additional limitations on the upper end of the frequency range which can be attained by this particular voltage-controllable state-variable oscillator.

Accordingly, a need remains for an accurate, high-frequency oscillator with improved phase noise.

SUMMARY OF THE INVENTION

It is, therefore, an object of the invention to improve the phase noise of quadrature oscillators.

Another object of the invention is to improve the accuracy of prior art quadrature oscillators.

A current-controlled quadrature oscillator based on differential gm/C cells is described. The oscillator according to the invention includes first and second gm/C integrator stages. The gm/C integrator stages or cells are based on the relationship between the transconductance (gm) and the collector current (Ic), referred to herein as the translinear relationship. This well-known property of the bipolar junction transistor allows the frequency of oscillation to be tuned across an extremely large frequency range.

The use of the gm/C stages in the oscillator also allows the oscillator to include cascaded stages of differential pairs arranged in so-called multi-tanh n-tuplets. These multi-tanh n-tuplets improve the linearity of the transconductance (gm) of the gm/C stages, through the use of two or more gm cells with deliberately introduced offsets in the device sizes.

The oscillator according to the invention also includes a plurality of common-mode biasing means used to bias the gm/C stages. In one embodiment, the common-mode biasing means includes a pair of common-mode transistors coupled between a positive supply voltage and a pair of common-mode terminals of the associated gm/C stage, and a common-mode biasing transistor having a control terminal coupled to the other gm/C integrator stage and a load terminal coupled to the control terminals of the first pair of common-mode transistors. In another embodiment of the common-mode biasing means, two current mirrors are used. In a further embodiment, two diodes are connected in series and coupled to each of the common-mode terminals of the gm/C stages. In a yet further embodiment of the biasing means, resistors are used.

Some embodiments to the invention further include a start-up means coupled to the pair of output terminals of the gm/C stages. The start-up means includes a pair of cross-coupled transistors coupled to the pair of output terminals and a biasing current source coupled to the pair of cross-coupled transistors. The start-up means is designed to have a negative input resistance whose absolute value is equal to or greater than a critical value (usually the input resistance of the next gm/C integrator stage). This start-up means forces the poles of the gm/C stages onto the right-hand plane of the S-domain to ensure oscillation.

An oscillation amplitude limiting means is used to keep the amplitude of the oscillations within bounds; this may be based on the use of clamping diodes.

In another aspect of the invention, an amplitude control circuit is described which is based on the trigonometric identity $\sin^2\omega t + \cos^2\omega t = 1$. The amplitude control circuit takes the two output signals, each having sinusoidal waveform and bearing a quadrature relationship ("sin/cos"), squares them, and sums them together to produce a sum of squares signal. This sum of squares signal is then compared to a reference signal to determine whether the amplitude of the quadrature oscillator signals is at the desired amplitude. This step may be integrated into the design of the squaring circuit, as in the preferred embodiment, to achieve a compact design. If the amplitude has exceeded the desired level, as indicated by the amplitude of the sum of squares signal, the control circuit produces a control current which is fed to damping diodes coupled to the differential outputs of the quadrature oscillator. The control current creates a shunt positive resistance across the shunt negative resistance of the quadrature oscillator, which in the preferred embodiment are formed of two differential gm/C stages. The shunt positive resistance causes the complex conjugate poles to move back toward the imaginary axis from their position in the right plane of the S-domain (that is from a regenerative mode of operation caused by the negative-resistance cells) to one in which regenerative and degenerative tendencies precisely cancel. The essentially constant damping current falls as the poles converge on the imaginary axis, until the current is essentially equal to that in the negative resistance cells, and the amplitude of the quadrature oscillator signals are at the desired amplitude.

An advantage of the invention is the oscillator's suitability for bipolar monolithic realization.

Another advantage of the invention is a wide tuning range of the oscillator over an unusually wide range, which may be as high as 100,000,000 to 1 under ideal conditions.

Another advantage of the invention is guaranteed start-up of the oscillator.

Another advantage of the invention is low voltage operation of the oscillator.

A further advantage of the invention is low power operation of the oscillator.

A yet further advantage of the invention is extremely high quadrature accuracy of the oscillator.

A yet further advantage of the invention is that the non-linearities in the regenerative elements (i.e., negative resistance cells) associated with each integrator stage are precisely canceled by the non-linearities of the damping diodes (positive resistance cells) whose bias currents at equilibrium are equal to those in the negative-resistance cells.

A yet further advantage of the invention is that any "self-damping" in the integrator stages is automatically counteracted by a small reduction in the equilibrium control current in the damping diodes.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 1 is a model for a prior art quadrature oscillator.

FIG. 2 is a prior art voltage-controllable state-variable oscillator.

FIG. 4 is a schematic of the startup (negative resistance) circuit of FIG. 3.

DETAILED DESCRIPTION

Figure 3:
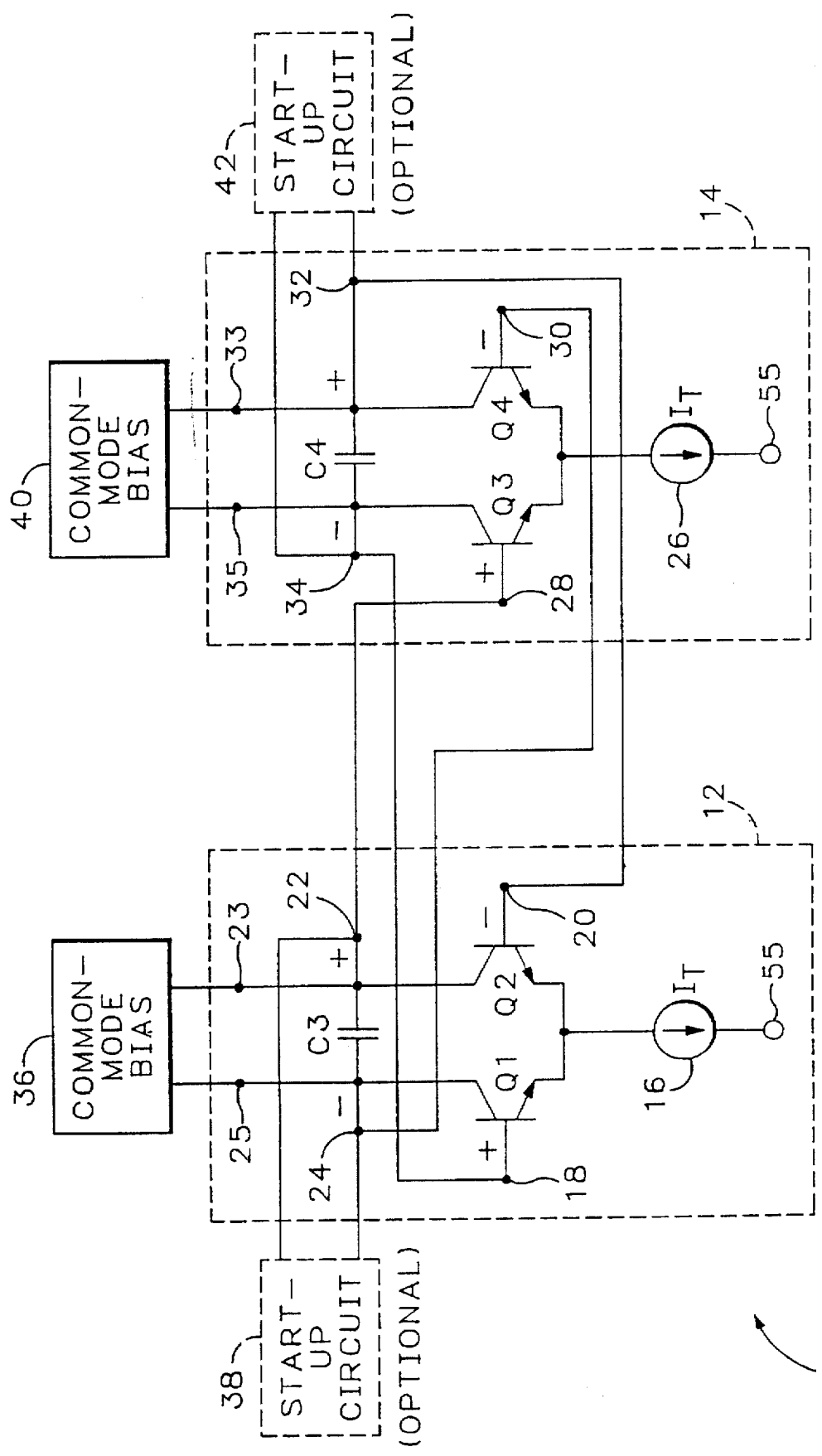
FIG. 3 is a schematic diagram of a current-controlled quadrature oscillator according to the invention.

Referring now to FIG. 3, a current-controlled quadrature oscillator 10 according to the invention is shown. The oscillator 10 includes a first gm/C stage 12 and a second gm/C stage 14. Each gm/C stage is comprised of, in its essence, a differential pair of transistors, a capacitor, and a tunable current source.

The first gm/C stage includes a pair of input terminals 18 and 20, a pair of output terminals 22 and 24, and a pair of common mode terminals 23 and 25. The first gm/C stage also includes a tunable current source 16 by which, as will be shown hereinbelow, the frequency of oscillation can be tuned over a large frequency range. A capacitor C3 is coupled across the output terminals 22 and 24 to introduce an integration function.

Similarly, the second gm/C stage 14 includes a pair of input terminals 28 and 30, a pair of output terminals 32 and 34, and a pair of common mode terminals 33 and 35. The second gm/C stage also includes tunable current source 26. A capacitor C4 is coupled across the output terminals 32 and 34. In the preferred embodiment, both capacitors C3 and C4 are formed by placing two physical capacitors back to back, wherein the capacitances of the two physical capacitors add. Although neither of the tunable current sources 16 and 26 are shown connected to a supply voltage, it is assumed that these tunable current sources are connected to some source of supply voltage at terminal 55, as is known in the art.

Each of the gm/C stages takes advantage of the relationship between the transconductance (gm) and the collector current $I_c$ of a bipolar junction transistor (BJT). The transconductance gm of a BJT is linearly proportional to its collector current, hence the term translinear. The translinear relationship is expressed below in Eq. 1.

$$gm = I_c/V_t \qquad \text{Eq. 1}$$

where $V_t$ is equal to the thermal voltage, kT/q, which evaluates to 25.85 mV at 300 K. (The gm/C stage uses this translinear relationship to create a tunable integrator stage. Consider the first gm/C stage 12. An output signal $V_{OUT}$ appearing across the output terminals 22 and 24 is equal to the current through the capacitor C3 ($I_{C3}$) multiplied by the impedance of the capacitor C3 (1/sC$_3$). The current through the capacitor $I_{c3}$ can be expressed as the transconductance (gm) of the transistors Q1 and Q2 times the input voltage ($V_{IN}$) appearing on the input terminals 18 and 20 of the gm/C stage. Substituting this expression for I in the previous equation, the output voltage can be expressed by the following equation:

$$V_{OUT} = g_m V_{IN}/sC_3 \qquad \text{Eq. 2}$$

The above expression can be put in a form of an integrator ($V_{OUT} = V_{IN}/sT$) yielding a time constant T equal to C3/gm. Therefore, the time constant of the gm/C stage is a function of the transconductance of the transistors, which is further a linear function of the collector current. The capacitor C3, in the preferred embodiment, is formed by two "back-to-back" capacitors so that their capacitances are additive.

The oscillator according to the invention takes advantage of this relationship to provide a tunable quadrature oscillator based on differential gm/C cells by varying the current in the tunable current sources 16 and 26. The first and second gm/C stages are connected so as to introduce an inversion or a 180 degree face shift in the loop.

As shown in FIG. 3, the output terminals 22 and 24 of the first stage are connected to the input terminals 28 and 30, respectively, of the second stage. The output terminals 32 and 34 of the second stage are connected to input terminals 20 and 18, respectively, of the first stage. By cross-coupling the output terminals in this way, a signal appearing on the input terminals 18 and 20 is 180 degrees out of phase with a concomitant signal appearing on the input terminals 28 and 30, whereby the oscillator oscillates.

Associated with each gm/C stage is a common mode bias circuit and a startup circuit. The first gm/C stage has a first common mode bias circuit 36 coupled to the common mode terminals 23 and 25 of the first stage. The common mode bias circuit 36 is a means for providing common mode bias current to the first gm/C stage 12. The invention as described herein includes numerous embodiments of the common mode bias circuit 36, which are described below. The common mode bias circuit 36 can also include amplitude limiting means for limiting the amplitude of oscillation of the signal appearing on the output terminals 22 and 24.

Each gm/C stage can further include an optional startup circuit 38 or 42 coupled thereto. The function of the startup circuit is to ensure that the oscillator starts oscillating. The startup circuit accomplishes this by moving the complex conjugate poles of the gm/C stage towards the right hand plane. In the ideal case, the startup circuit would position the complex conjugate poles along the imaginary axis. However, in practice, the startup circuit actually moves the complex conjugate poles into the right hand plane. In this case, the amplitude limiting means of the common mode bias circuit keeps the amplitude of the output signal from growing out of bounds. Some embodiments of the invention do not require this start-up circuit, as will be shown below.

Referring now to FIG. 4, the preferred embodiment of the startup circuit 38 is shown. The startup circuit 38 includes a cross-coupled pair of transistors Q5 and Q6 and a current source 44 coupled to the emitters thereof. The transistors Q5 and Q6 are connected so that the collector of one transistor is connected to the base of the other transistor to form the cross-coupled connection. The collector of transistor Q5 forms a terminal 48 that is coupled to one of the output terminals of the first gm/C stage while the collector of transistor Q6 forms another terminal 50 which is coupled to the other output terminal of the first gm/C stage.

The startup circuit 38 produces a negative resistance, as seen looking in terminals 48 and 50, which essentially compensates for the input resistance of the next gm/C stage 14. If the magnitude of the negative resistance of the startup circuit 38 were exactly equal to the (positive) input resistance of the second gm/C stage the complex conjugate poles of the first gm/C stage would lie exactly on the imaginary axis. Because this precise balance is difficult to achieve in practical circuits, in the preferred embodiment, the negative resistance of the startup circuit 38 is made greater than, in absolute value terms, the input resistance of the second gm/C stage so as to push the complex conjugate poles of the first gm/C stage into the right hand side of the S-plane. An amplitude limiting means, discussed below, is then used to prevent excessive build-up of the voltages.

As will be apparent to those skilled in the art, the magnatude of the negative resistance of the startup circuit 38 is a function of the current $I_Z$ provided by current source 44. One of ordinary skill in the art could select a current $I_Z$ that would produce the desired negative resistance. In order to ensure oscillation, the current $I_Z$ provided by the current source of the associated startup circuit must be equal to K×$I_T$, where K is a design factor. The final amplitude of the signal appearing on the output terminals is then a function of K.

The startup circuit 38 can also include a second current source 46, which produces a current $\alpha \times I_T$, where $I_T$ is equal to the current produced by the tunable current source 16. This additional current source 46 can be included where the common mode bias circuit 36 includes resistors coupled between a positive supply voltage and a corresponding common mode terminal, as described further below. The startup circuit 42 of the second gm stage 14 is substantially identical to the startup circuit 38 and is therefore not shown in detail.

Figure 5:
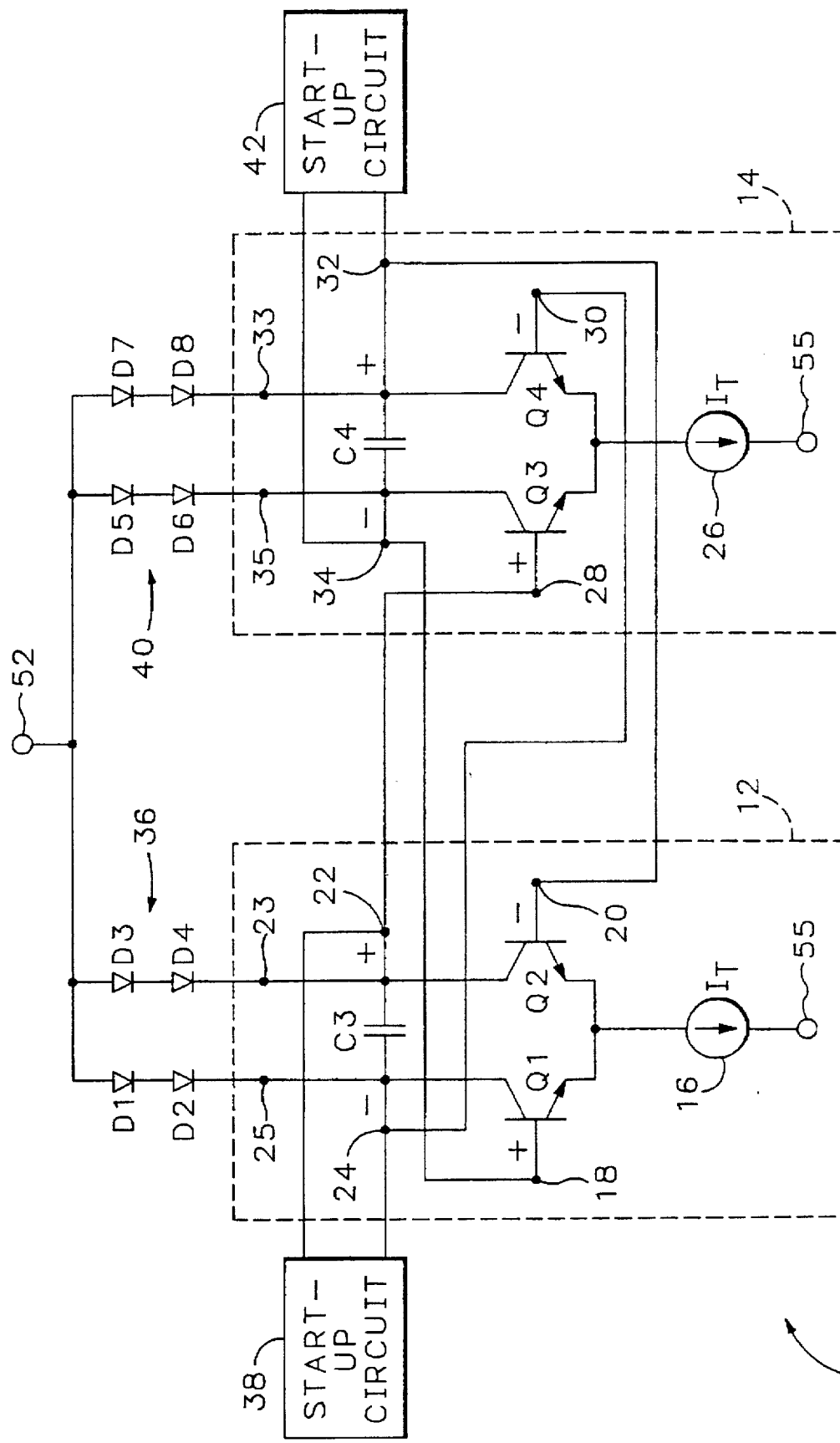
FIG. 5 is a schematic diagram of another embodiment of the current-controlled quadrature oscillator according to the invention.

Referring now to FIG. 5, a first embodiment of the common mode biasing circuits 36 and 40 are shown. This embodiment includes two pairs of biasing diodes, e.g., D1-D2 and D3-D4. The two diodes in each pair are connected in series. Each pair of biasing diodes is coupled between a positive supply voltage supplied to positive supply terminal 52 and a respective one of the output terminals of the associated gm/C stage. These diodes can be implemented either as discrete diodes or as diode-connected transistors, as is known in the art.

Figure 6:
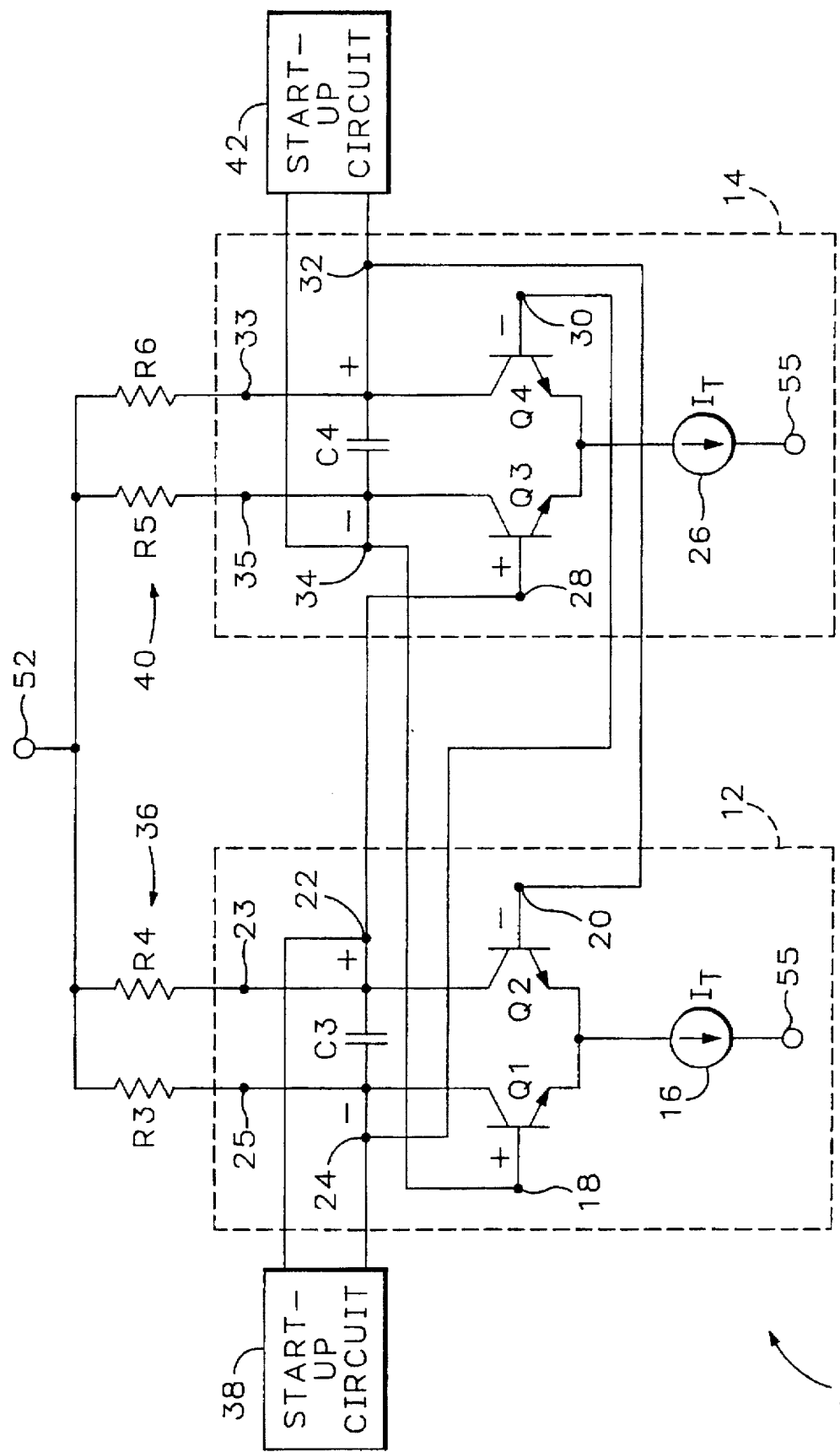
FIGS. 6, 7 and 8 are schematic diagram of still other embodiments of the current-controlled quadrature oscillator according to the invention.

Referring now to FIG. 6, an alternative embodiment of the common mode biasing circuits 36 and 40 is shown. In this embodiment, the common mode biasing circuits include a pair of biasing resistors, e.g., R3 and R4, with each one of the pair of biasing resistors being coupled between the positive supply voltage and a respective one of the pair of output terminals of the associated gm/C stage. If this common mode biasing circuit is used, an additional current source is used in the startup circuit such as current source 46 of FIG. 4 to provide a negative resistance component to cancel the positive resistance of the load circuit.

Figure 7:
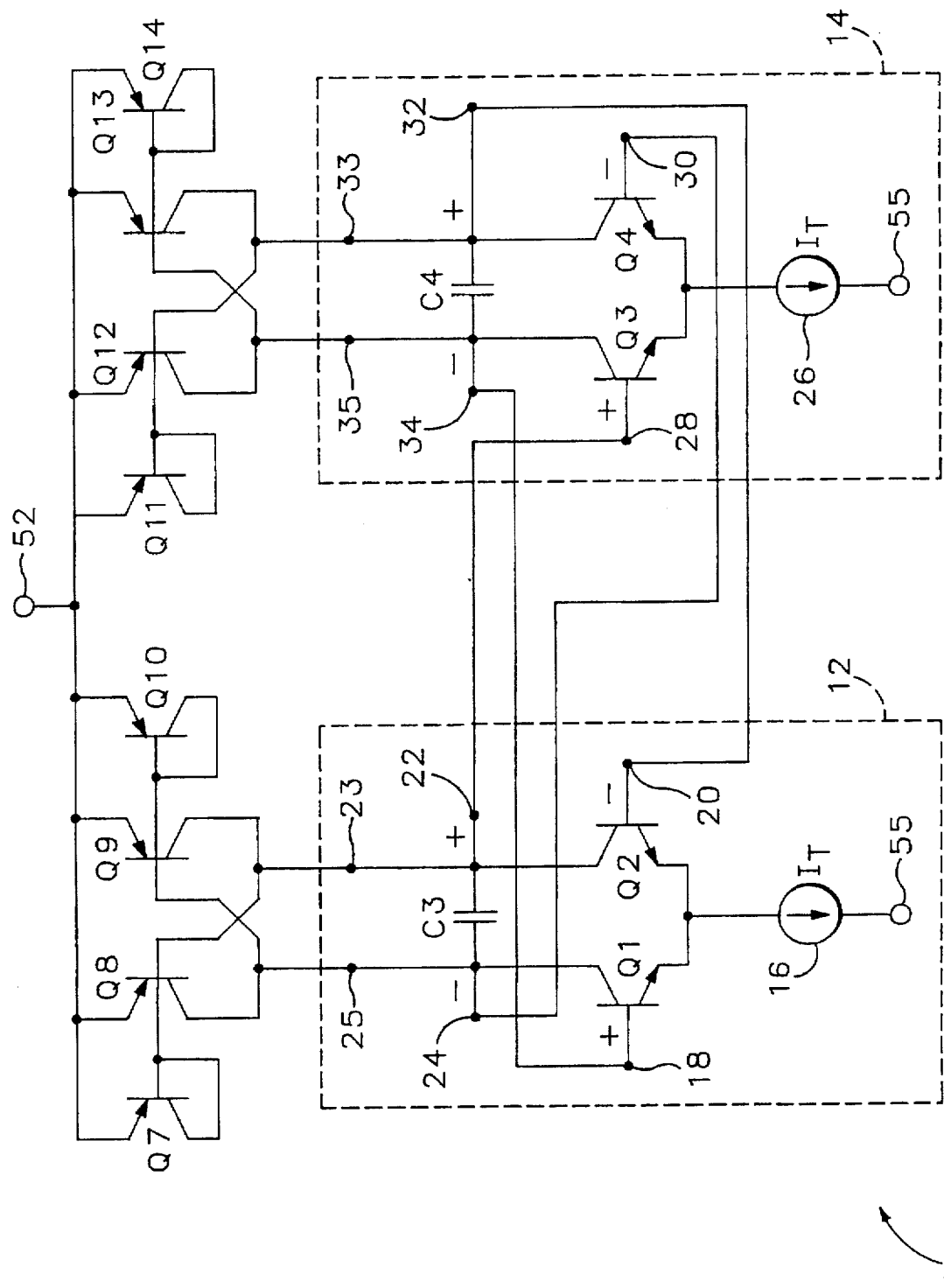

Referring now to FIG. 7, the yet further embodiment of the common mode biasing circuits 36 and 40 is shown. This embodiment includes two current mirrors. For example, the first common mode biasing circuit 36 is comprised of a first current source including a first diode-connected transistor Q7 and a first mirror transistor Q8. The common mode biasing circuit 36 also includes a second current mirror comprised of a second diode-connected transistor Q9 and a second mirror transistor Q10. In the preferred embodiment, the diode-connected transistors and the mirror transistors are PNP transistors.

As shown in FIG. 7, the emitters of the transistors Q7–Q10 are coupled to the positive supply voltage at terminal 52. As also shown therein, the collector of the diode-connected transistors are coupled to a respective one of the common mode terminals while the collector of the associated mirror transistor is coupled to the other common mode terminal. The second common mode biasing circuit 40 is connected in substantially identical fashion to the second gm/C stage 14.

In the preferred embodiment of this implementation of the common mode biasing circuits, the emitter areas of the diode-connected transistor and the associated mirror transistor have a ratio equal to 1:1+Δ. This additional emitter area provides a regeneration current by which the gm/C stage oscillates. Thus, this common-mode biasing means eliminates the need for a separate start-up circuit.

Figure 8:
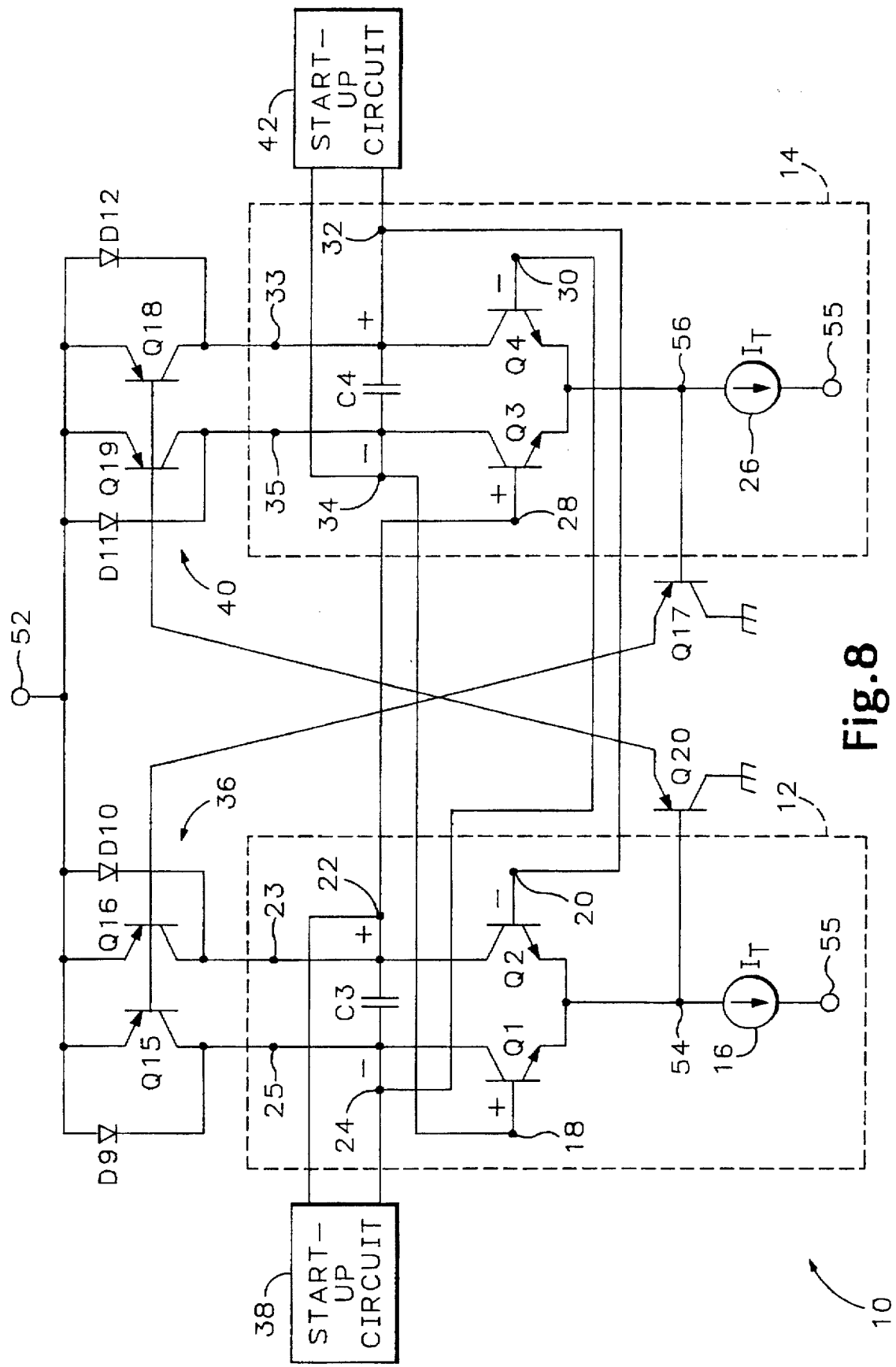

Referring now to FIG. 8, another embodiment of the common mode biasing circuits 36 and 40 is shown. In the embodiment shown in FIG. 8, the common mode biasing circuits include a pair of common mode transistors and a biasing transistor. The biasing transistors are coupled between the positive supply voltage and the common mode terminals of the associated gm/C stage, with each one of the pair of common mode transistors being coupled between the positive supply voltage and the respective one of the common mode terminals. Each of the common mode transistors further includes a control terminal. In the preferred embodiment, the control terminal is the base of the transistors. The biasing transistor includes a control terminal coupled to the opposite gm/C stage, and a load terminal coupled to the control terminals of the associated pair of common mode transistors.

Specifically, the common mode biasing circuit 36 includes common mode transistors Q15 and Q16 and a biasing transistor Q17. In the preferred embodiment, the pair of common mode transistors and the biasing transistor are PNP transistors. The PNP transistors can be formed either using a complementary bipolar process or, in the event such a complementary process is unavailable, the pair of common mode transistors can be formed as lateral transistors and the emitter followers (Q17,Q20) can optionally be formed using vertical PNP transistors. Although a lateral PNP transistor has a lower current gain and a low cutoff frequency, this does not fundamentally limit the bandwidth of the oscillator because these common mode transistors are used solely for biasing purposes.

As shown in FIG. 8, the base of the biasing transistor Q17 is coupled to the second gm/C stage 14 at node 56. Although the biasing transistor Q17 consumes some base current, this has a negligible effect on the oscillator circuit. For example, the base current required by biasing transistor Q17 ($I_{17}$) is equal to $I_T/(\beta_{PNP})^2$.

The oscillator circuit of FIG. 8 also includes means for limiting the amplitude of a signal appearing across the output terminals of the gm/C stages. The limiting means for the first gm/C stage 12 includes diodes D9 and D10 and the limiting means for the second gm/C stage 14 includes diodes D11 and D12. These amplitude limiting diodes D11–D12 limit the amplitude at the corresponding output terminals to a predetermined range, e.g., 200 mV. These amplitude limiting diodes prevent the oscillator from becoming unstable in the event the startup circuits 38 and 42 place the complex conjugate poles of the associated gm/C stages into the right hand plane.

Figure 9:
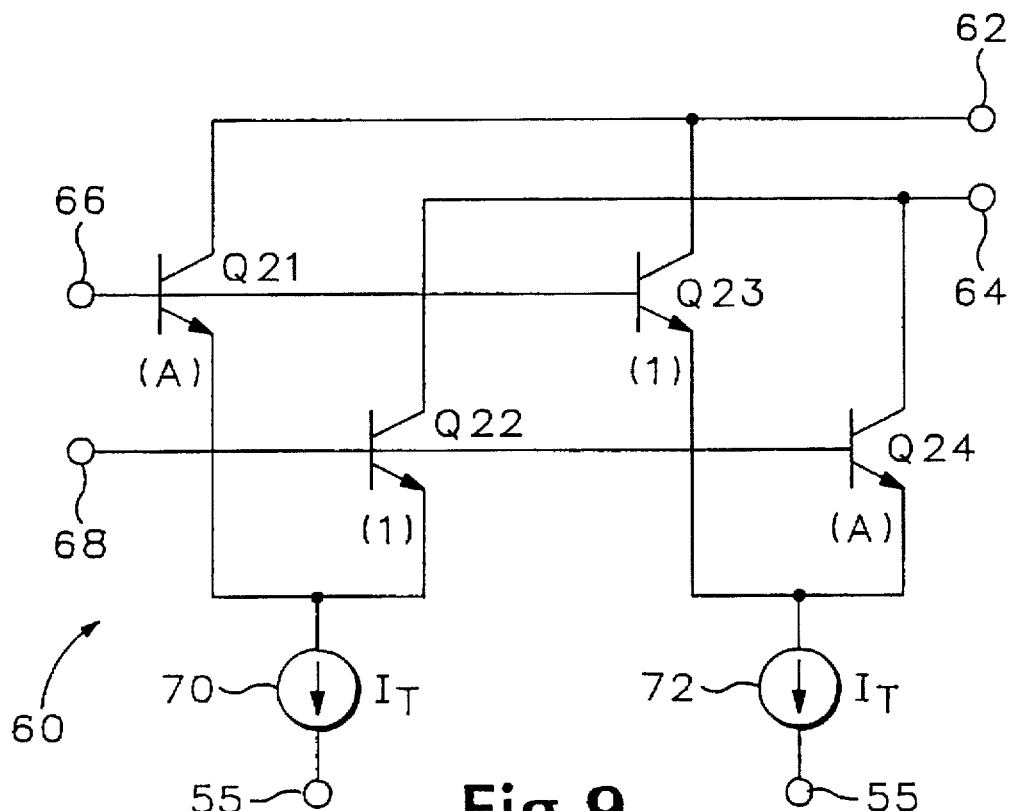
FIG. 9 is a schematic diagram of a multi-tanh doublet (with emitter area sizes shown) that can be used in place of the differential pair in the gm/C stages of FIG. 3.

Referring now to FIG. 9, an alternative embodiment of the gm portion of the gm/C stage is shown generally at 60. The circuit 60 is referred to herein as a multi-tanh doublet. The multi-tanh doublet 57 makes the gm stages more linear by effectively combining two differential pairs into a single gm stage. The multi-tanh doublet derives its name from the current versus voltage relationship of a simple BJT differential pair, which can be described by a tanh (hyperbolic tangent) function. The multi-tanh doublet is formed by two BJT differential pairs, each operating at the same bias current but with differing emitter areas, so as to extend the linear range of the composite gm stage.

Figure 10:
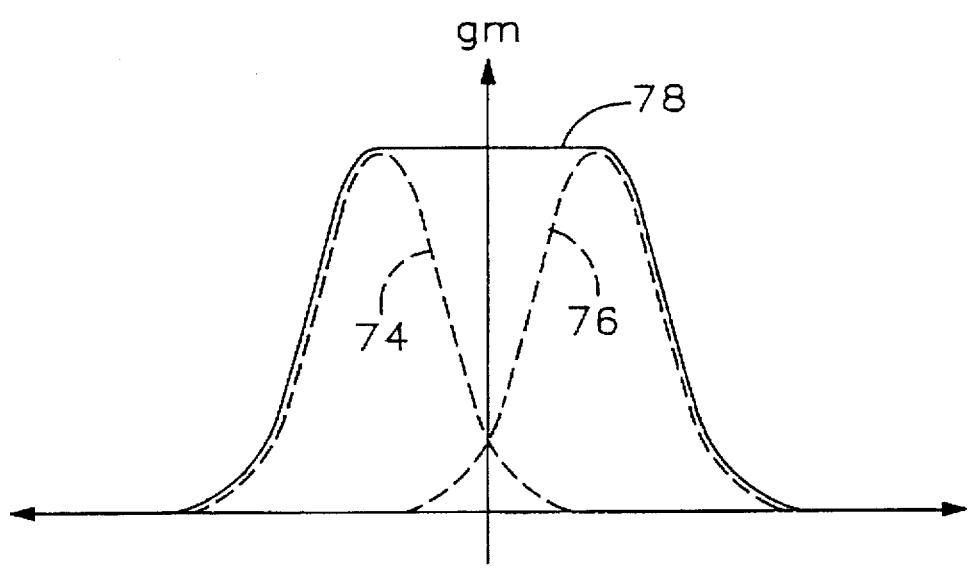
FIG. 10 is a plot of the transconductance of the multi-tanh doublet of FIG. 9.

The improved linearity of the multi-tanh doublet 60 can be seen by reference to the transconductance (gm) plots in FIG. 10. The transconductance gm, i.e., the differential incremental gain, of a BJT differential pair is given by a sech$^2$(hyperbolic secant-squared) function, as is known in the art. In FIG. 10, a first plot 74 for the differential pair consisting of transistors Q21 and Q22 is shown. A second plot 76 for the differential pair consisting of transistors Q23 and Q24 is also shown. The two plots indicate the assymmetry of the two differential pairs. Plot 78 represents the sum of the two plots 74 and 76, which corresponds to the combined transconductance of the multi-tanh doublet 60. As can be seen by the plot 78, the gm of the doublet 60 has an extended linear range. This principle can be extended to any number of differential pairs yielding a generic multi-tanhn-tuplet to produce a further extended linear range of transconductance. These multi-tanh n-tuplets can be substituted for the simple BJT differential pairs of the oscillators shown in the FIGS. 3–8.

Figure 11:
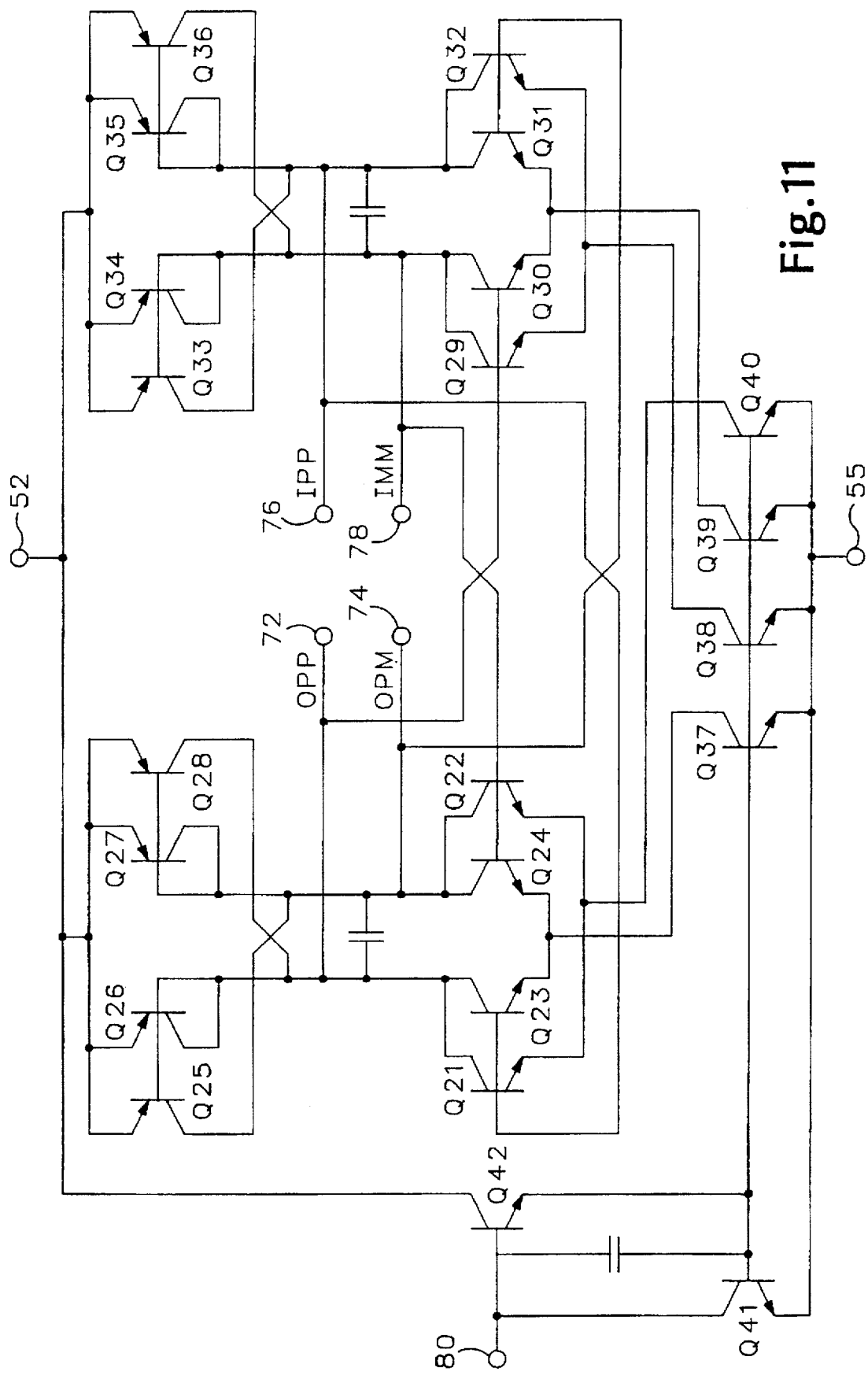
FIG. 11 is a schematic diagram of another embodiment of the current-controlled quadrature oscillator according to the invention which uses the multi-tanh doublet of FIG. 9.

A schematic diagram of another embodiment of a current-controlled quadrature oscillator which uses the multi-tanh doublet of FIG. 9 is shown in FIG. 11. The first gm/C stage 12 includes a multi-tanh doublet comprised of transistors Q21–Q24. The multi-tanh doublet of the second gm/C stage 14 includes transistors Q29–Q31.

Each of the transistor pairs, e.g., Q21–Q22, are coupled to a respective controllable current source for controlling the collector currents and, therefore, the transconductance of the transistor pair. In the embodiment shown in FIG. 11, the current sources are comprised of single transistors (Q31–Q40) with the collector of each transistor being coupled to the emitters of the corresponding pair. Many other embodiments of the current sources can be used.

The oscillator 10 of FIG. 11 also includes a front end circuit including transistors Q41 and Q42 and capacitor C5. The front end circuit is coupled to the bases of transistors Q37–Q40 for providing a bias current thereto. The front end circuit includes a control terminal 80 for receiving a control current thereon. The front end circuit supplies the bias current to the transistors Q37–Q40 responsive to the control current received on terminal 80. Other front-end circuits can be used for generating the bias current responsive to the control signal, as is known in the art.

In operation, the transistors Q37–Q40, responsive to the bias circuit, generate collector currents proportional to the current applied to terminal 90, which in turn changes the transconductance (gm) of the respective gm/C stage. This change in transconductance changes the effective time-constant of each integrator stage. Therefore, by changing the control current at terminal 80, the oscillation frequency of the oscillator can be tuned over an extremely wide range of frequencies given the translinear principle on which the gm/C stages operate. An exponential control of frequency can be provided by applying a voltage directly to the base-emitter terminals of transistors Q37–Q40.

Figure 12:
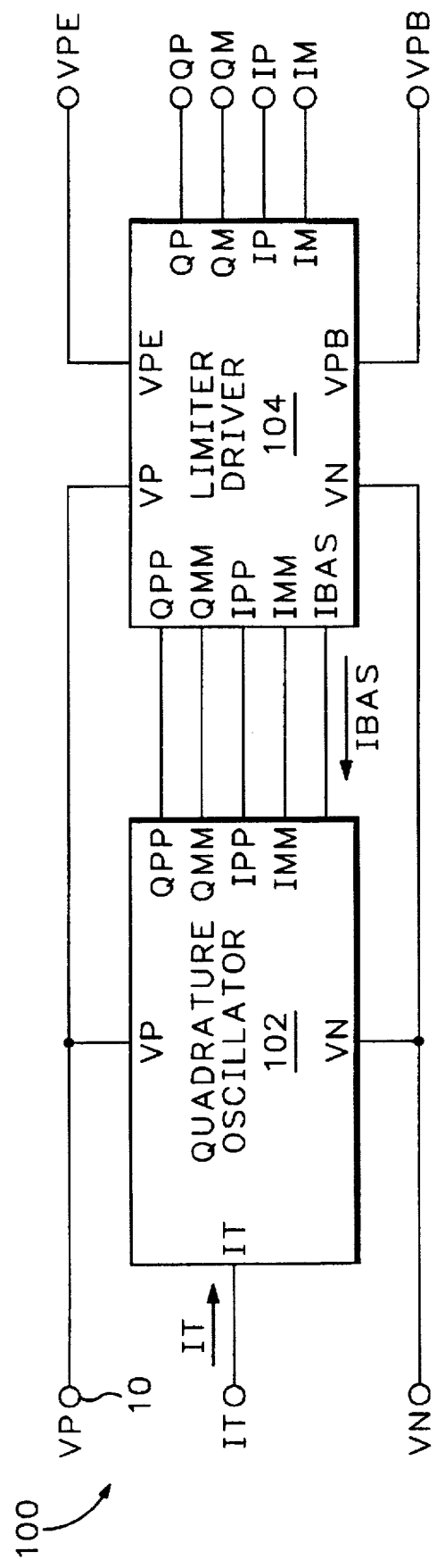
FIG. 12 is a block diagram of another embodiment of the current-controlled oscillator having additional means to convert the sinusoidal oscillator voltages to a square-wave output according to the invention.

Referring now to FIG. 12, another embodiment of a current-controlled quadrature oscillator according to the invention is shown generally at 100. This embodiment includes a quadrature oscillator block 102 and a limiter driver block 104. The quadrature oscillator 102 includes four inputs: a positive supply voltage input VP, a negative supply voltage input VN, a frequency control input IT, and a base-current correction input IBAS. The two supply voltage inputs, as their names imply, receive the two supply rails. The frequency control input IT receives a frequency control current IT, which controls the frequency of oscillation as in the embodiment shown above. The remaining input IBAS is coupled to a corresponding output of the limiter driver block 104 to receive a current $I_{BAS}$. This current, as described further below with reference to FIGS. 13 and 14, alters the negative resistance of the start-up circuits in the oscillator block 102 to compensate for the load placed on the oscillator outputs (QPP, QMM, IPP, IMM) by the limiter block 104.

The limiter block 104 is included to convert the two sinusoidal outputs of the quadrature oscillator block 102 to two essentially square-wave signals, conventionally required to drive two demodulators operating in quadrature. A demodulator requires square-wave input signals on its "local oscillator" port to achieve a high conversion gain and low noise. The first of these two square-wave output signals appears across outputs QP and QM while the other is presented on outputs IP and IM. The limiter block 104 also includes two positive supply voltage inputs (VP, VPE) as well as a bias voltage input VPB. Each of these inputs serves the function of either providing a supply voltage or a bias voltage to the circuit, as can be seen with reference to FIG. 14.

Figure 13:
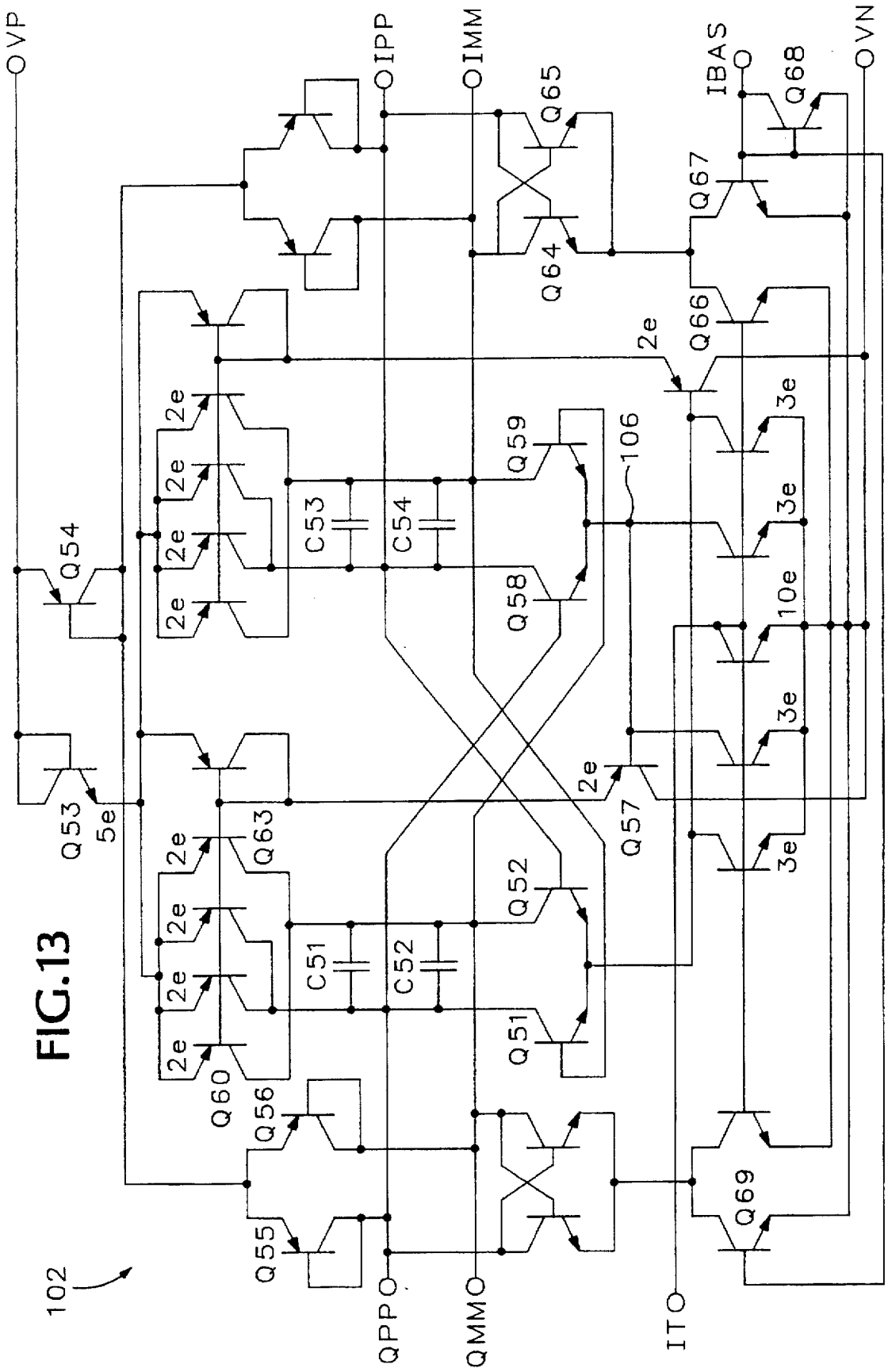
FIG. 13 is a schematic diagram of the quadrature oscillator shown in FIG. 12.

Referring now to FIG. 13, a schematic diagram of the quadrature oscillator block 102 is shown. The quadrature oscillator shown in FIG. 13 is similar to that shown in FIG. 8 in that both use similar gm/C cells and similar common node biasing. Accordingly, those elements previously shown are not discussed further herein. There are, however, several differences which are elaborated on below.

There are two main changes to the oscillator shown in the prior drawings. The first is the addition of diode connected transistors Q53 and Q54. These transistors were added to the basic design shown at FIG. 8 in order to stabilize the output voltage across process variations. Referring again to FIG. 8, the voltage drop from the positive supply terminal 52 to the emitters of transistors Q3 and Q4 can be calculated in two ways. First, there are two base-to-emitter voltage drops across ($V_{BE}$) transistors Q15 or Q16 and transistor Q17. All of the transistors Q15–Q17 are PNP transistors. The other way to figure the voltage drop, for example, is the voltage drop across the base-to-emitter junctions of transistors Q3 and diode D10 (assuming diode D10 is implemented as a diode-connected transistor, which it is in the preferred embodiment). At least one of the transistors, and more likely both transistors, in this latter path (Q3+D10) are NPN transistors.

Process variations can produce different base-to-emitter voltages ($V_{BE}$) for NPN as compared to PNP transistors. As a result of this process variation, the voltages across the two PNP transistors fight the voltage drop across the two NPN transistors thereby producing a certain amount of instability in the amplitude of the sinusoidal output signals. This problem has been overcome by the embodiment shown in FIG. 13.

Referring again to FIG. 13, the quadrature oscillator 102 has equalized the voltage drops across these two paths with the addition of diode-connected transistors Q53 and Q54 and by changing the amplitude control diodes to PNP diode-connected transistors. Now both paths to the emitters of the gm/C cells include two PNP base-to-emitter voltage drops and one NPN base-to-emitter voltage drop. Therefore, any process variation will be reflected equally in the two paths thereby eliminating the contention of the design of FIG. 8. For example, between the supply voltage terminal VP and common emitter node 106 of the gm/C cell comprised of transistors Q58 and Q59, the two voltage paths can be calculated as follows. First, there are two PNP base-to-emitter voltage drops due to transistors Q54 and Q55 or Q56. From there, there is an additional NPN base-to-emitter voltage drop across either transistors Q58 or Q59 to get to the common emitter node 106. In the other path, beginning now from common emitter node 106, there are two PNP base-to-emitter voltage drops due to transistor Q57 and, for example, transistor Q63. In addition, there is an NPN base-to-emitter voltage drop across diode-connected transistor Q53. Thus, the voltage drop between the supply voltage terminal VP and the common emitter node 106 of the gm/C cell in both paths is identical. This is true for both gm/C cells. As a result, the quadrature oscillator 102 has improved amplitude control across process variations.

The other difference between oscillator 102 and those shown above is the addition of a second current source (e.g., Q67) in each of the start-up circuits. These additional variable sources provide an additional bias current to the cross-coupled transistors (e.g., Q64 and Q65) of the start-up circuit in order to change the negative resistance of the start-up circuit to compensate for the loading effects of the limiter stage 104. Before discussing the details of this implementation, a brief discussion of the limiter stage is in order.

Figure 14:
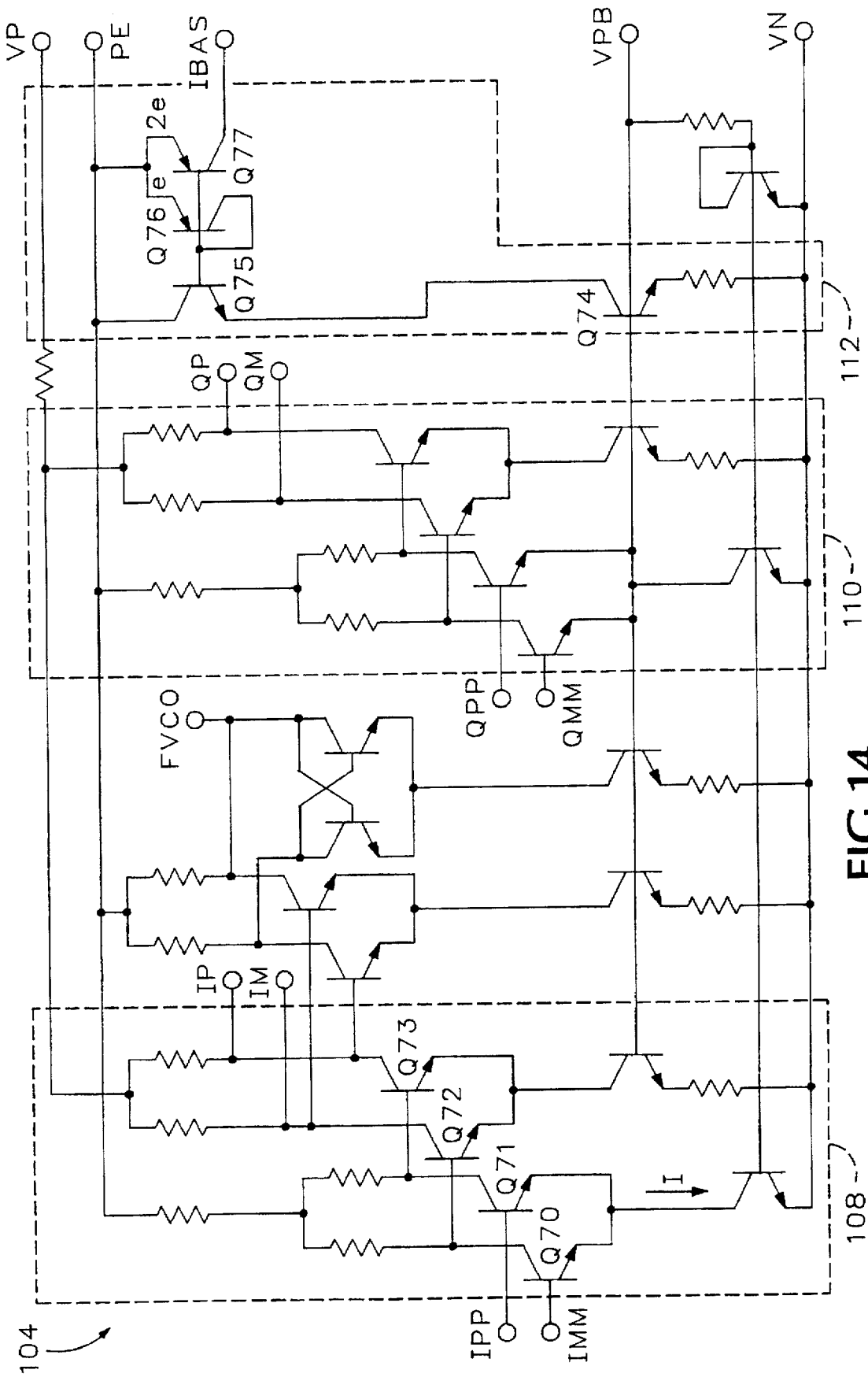
FIG. 14 is a schematic diagram of the limiter circuit shown in FIG. 12.

Referring now to FIG. 14, a schematic diagram of the limiter stage 104 is shown. For each pair of inputs (e.g., IPP and IMM), the limiter stage 104 includes a two-stage limiter amplifier (e.g., 108). For limiter amplifier 108, for example, the first stage includes a first differential pair of transistors Q70 and Q71 and the second stage includes a second differential pair of transistors Q72 and Q73. The outputs of the first stage are connected to the inputs of the second stage in a conventional manner. The gain of these two stages converts the sinusoidal input signal appearing on inputs IPP and IMM to a square-wave representation appearing on outputs IP and IM. A similar two-stage amplifier 110 is included for the second set of inputs QPP and QMM.

The first amplifier stage (Q70, Q71) loads down the corresponding pair of outputs of the quadrature oscillator 102. The amount of loading can be represented by a resistor $R_{BS}$ that is a function of the betas ($\beta$) of the transistors Q70 and Q71 and their incremental emitter resistances ($r_e$), as is known in the art. This loading resistance can be represented by the following expression:

$$R_{BS} = 2 \times \beta \times r_e$$

where $r_e = V_t/I$ and I is the current through each of the transistors Q70 and Q71.

This resistance shunts the capacitors of the associated gm/C cell. To compensate for this shunt resistance $R_{BS}$, the limiter block 104 includes a current detector circuit 112 that adjusts the negative resistance of the start-up circuits by an amount equal to the shunt resistance $R_{BS}$. The detector circuit 112 generates the current $I_{BAS}$ which is provided to the additional current sources of the start-up circuits. The current sources provide an additional bias current to the cross-coupled transistors that comprise the start-up circuits in response to the current $I_{BAS}$ thereby changing their negative resistance. This change in negative resistance matches the additional resistance due to the shunt resistance $R_{BS}$.

The current detector circuit 112 includes a current source transistor Q74 that provides a proxy for the current through the first stage of the limiter amplifier 108. A cascode transistor Q75 is connected in series with transistor Q74 to provide a beta-sample of this current. This beta-sample is fed to the base of a diode-connected transistor Q76, which is coupled to a mirror transistor Q77 that forms a current mirror with transistor Q76. The current $I_{BAS}$ through Q77 is a scaled version of the current in Q76 because the emitter of Q77 is scaled with respect to Q76 (i.e., 2e:e).

The collector of Q77 is coupled to another diode-connected transistor Q68 in the oscillator block 102 (FIG. 13). The transistor Q68 sinks the current $I_{BAS}$ and thereby produces a base-to-emitter voltage ($V_{BE}$) thereacross. This base-to-emitter voltage is impressed on the base-to-emitter junctions of the two additional current source transistors Q67 and Q69 of the two start-up circuits thereby inducing a current to flow in these two transistors. This additional current is provided to the respective start-up circuit, which alters the negative resistance of the start-up circuit. This change in the negative resistance completely compensates for the shunt resistance of the limiter stage 104.

The additional current sources not only compensate for the loading of the limiter stage but they also eliminate the need for any emitter degeneration resistors in the current source transistors of the other current source transistors (e.g., Q66) of the start-up circuits, which may be required to ensure start-up over all frequencies. By eliminating these resistors, the quadrature oscillator according to the invention is purely translinear. In fact, simulations have shown that the oscillator shown in FIG. 13 can be tuned over a 100,000,000:1 range, and practical embodiments over a range of at least 1,000,000:1, i.e., from 100 Hz to 100 MHz.

Figure 15:
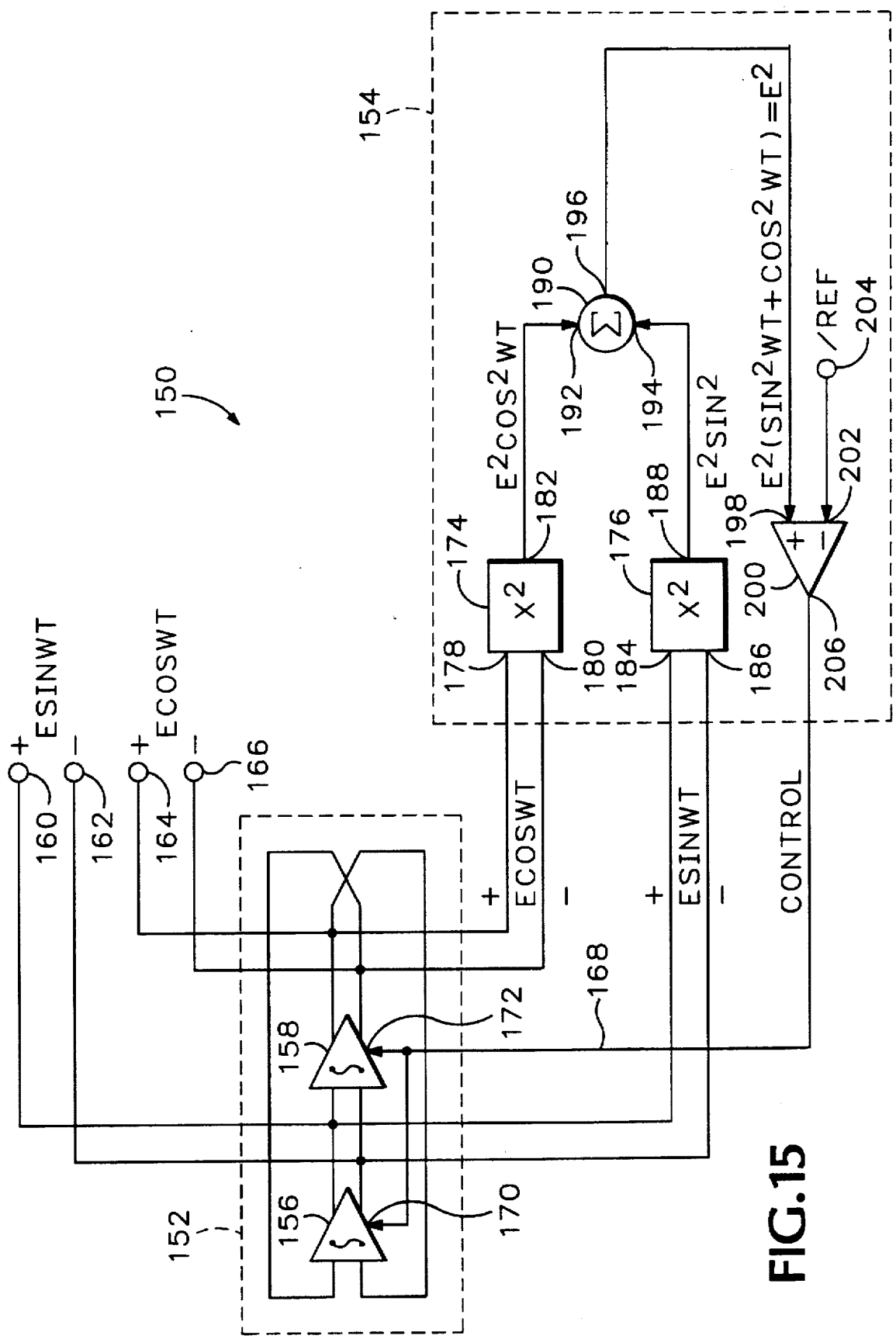
FIG. 15 is a block diagram of yet another embodiment of the current-controlled oscillator with an amplitude control circuit based upon a trigonometric identity according to the invention.

Referring now to FIG. 15, a yet further embodiment of a quadrature oscillator according to the invention is shown. The oscillator shown generally at 150 includes two main components: an oscillator core 152 and an amplitude control circuit 154. The oscillator core 152 includes two integrator stages 156 and 158 connected in series so that each integrator produces a 90 degrees phase shift thereby producing a 180 degrees phase shift through the loop. In the preferred embodiment, as described below, each of these integrator stages is based on a gm/C stage. The amplitude control approach described in the following section, however, is not limited thereto.

As in the oscillators described above, the first integrator stage 156 has a differential output connected to a differential input of integrator 158. The differential output of the first integrator stage includes outputs 160 and 162 across which a first quadrature oscillator signal Esinωt is produced. Similarly, the second integrator stage 158 includes a pair of differential outputs 164 and 166 across which a second quadrature oscillator signal Ecosωt is produced. This second quadrature oscillator signal is 90 degrees out of phase with the first quadrature oscillator signal thereby producing the sine and cosine relationships between the two. Each of the signals has a peak amplitude E that closely tracks the other as a result of the amplitude control as a result of the amplitude control means described below. The differential output of integrator stage 158 is then cross-coupled to a differential input of integrator stage 156 so as to produce the necessary phase shift through the loop to induce oscillation.

The oscillator 152 includes a control input 168 that is coupled to the amplitude control circuit 154 to receive a control or damping signal CONTROL, which is a current in the preferred embodiment. This control input 168 is further connected to control inputs 170 and 172 of the first and second integrator stages, respectively. The control signal, as described further below, reduces the amplitude of the two quadrature signals by invoking a trigonometric identity.

The amplitude control circuit 154 includes two squaring circuits 174 and 176. The squaring circuits each perform a mathematical squaring function of their respective input signals and not signal slicing. Squaring circuit 174 has a pair of inputs 178 and 180 that are connected to differential outputs 164 and 166, respectively, of the integrator stage 158. A square signal $E^2cos^2\omega t$ is produced by the squaring circuit 174 on an output 182. This squared signal, as mentioned above, is a true mathematical square of the input signal received by the squaring circuit, i.e., Ecosωt. The other squaring circuit 176 similarly includes a differential pair of inputs 184 and 186 that are connected to the differential outputs 160 and 162 of the integrator stage 156 and includes an output 188 on which square signal $E^2sin^2\omega t$ is produced.

The outputs 182 and 188 of the squaring circuits are connected to respective inputs 192 and 194 of a summing circuit 190. The summing circuit 190, as the name implies, sums the two squared signals together to produce a sum of squares signal on output 196. Because of the trigonometric identity $sin^2\omega t + cos^2\omega t = 1$, the amplitude of the signal produced by the summing circuit 190 is equal to $E^2$. Thus, the amplitude control circuit 154 produces a signal that is proportional to the amplitudes of the two quadrature oscillator signals. The circuit 154 uses this signal then to adjust the amplitude of the quadrature oscillator signals responsive to this signal until it reaches a desired amplitude.

The output 196 of summer 190 is connected to a first input 198 of a difference amplifier 200. A second input 202 is connected to a reference terminal 204 to which a reference signal REF is applied. This reference signal REF establishes the desired amplitude of the two quadrature oscillator signals. An output 206 of the amplifier 200 is connected to the control input 168 of the oscillator 152 to provide the control signal (CONTROL) thereto. The control signal (CONTROL) is a function of the difference between the sum signal ($E^2$) and the reference signal (REF). As the summed signal increases in amplitude above the amplitude of the reference signal, an essentially constant signal (CONTROL) is supplied to the integrator stages. This signal has the effect of reducing the amplitude of the two quadrature oscillator signals by providing some damping to the regenerative integrator stages.

Figure 16:
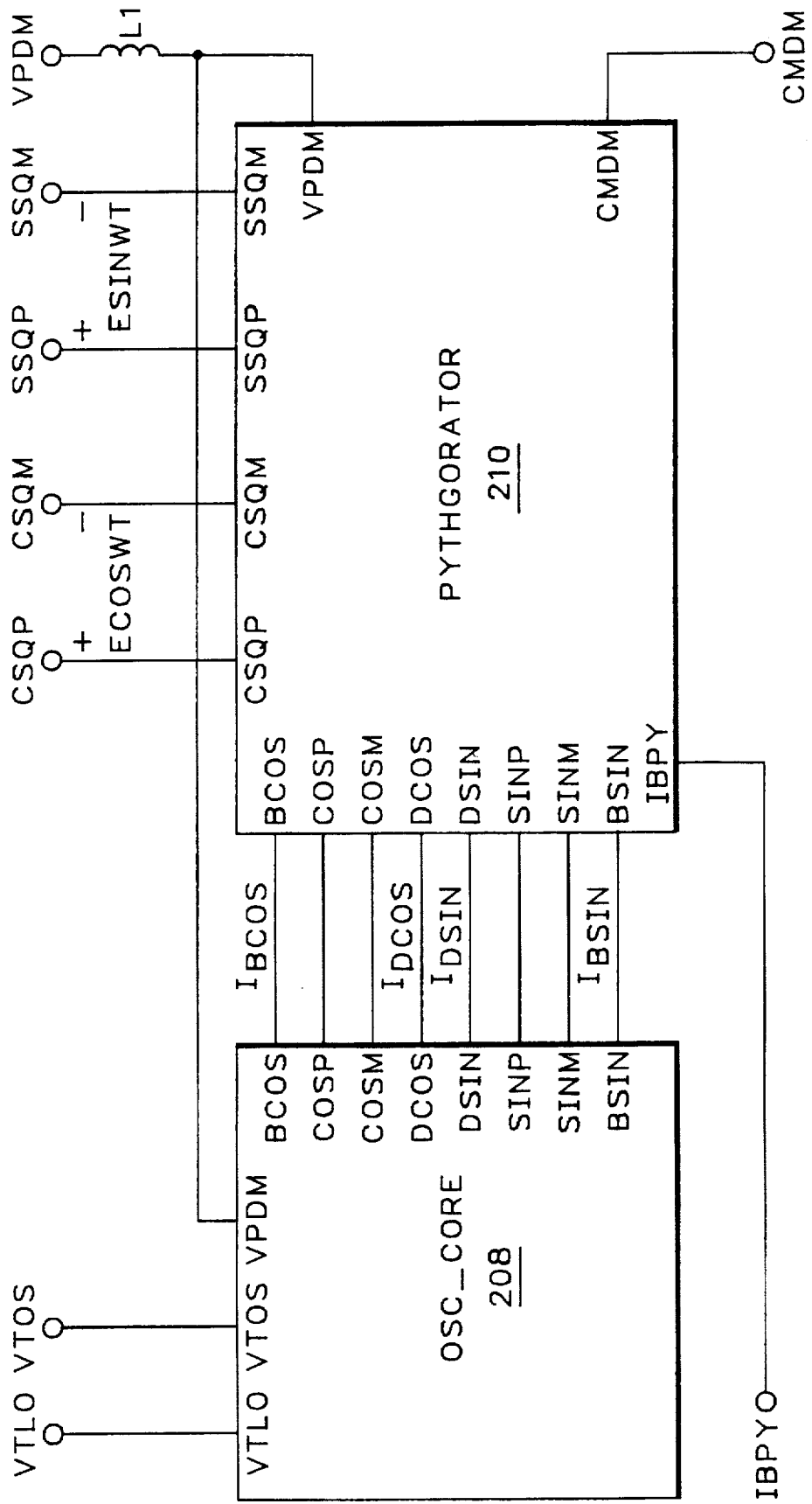
FIG. 16 is a block diagram of the preferred embodiment of the oscillator shown in FIG. 15.

A block diagram of the preferred embodiment of the oscillator 150 is shown in FIG. 16. The block diagram is broken up into two components: an oscillator core 208 and a so-called Pythagorator 210. The oscillator core 208 corresponds to the oscillator 152 shown in FIG. 15 and the Pythagorator 210 corresponds to the amplitude control circuit 154. There are differences between the two, however, because of the differences in implementation, which are described further below.

Figure 17:
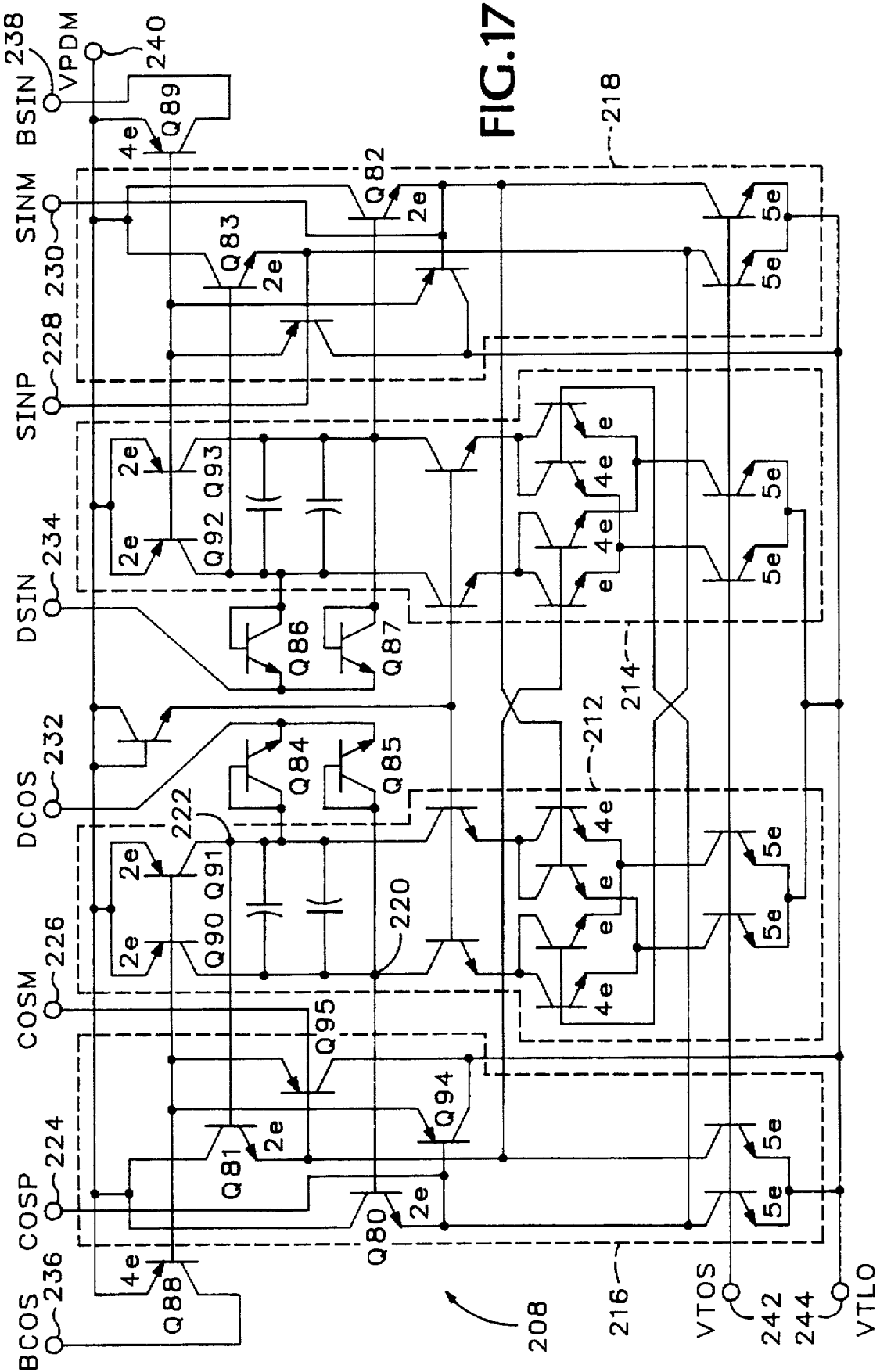
FIG. 17 is a schematic diagram of the quadrature oscillator of FIG. 16.

A schematic diagram of the oscillator core 208 is shown in FIG. 17. The oscillator core 208 includes two gm/C stages 212 and 214, each of which uses a multi-tanh doublet having a four to one emitter area ratio in lieu of a single differential pair of transistors, as described above. Each also includes a pair of capacitors in parallel to form the capacitive elements in the gm/C stage. As described above, transistors Q90 and Q91 (which could optionally be replaced with a cross-quad) provide a negative resistance to the gm/C stage that has a regenerative effect on the stage. This pair is accordingly referred to as a negative resistance cell. Transistors Q92 and Q93 provide a similar negative resistance to stage 214. The transistors Q90–Q93, in effect, push the complex poles of the oscillator core into the right half of the S-plane (RHP).

The outputs of the gm/C stages are buffered from the Pythagorator 210 by a respective pair of NPN emitter followers. For example, differential outputs 220 and 222 of gm/C stage 212 are buffered by emitter followers Q80 and Q81, respectively. The outputs of emitter followers Q80 and Q81 are connected to a pair of differential outputs 224 and 226 across which a quadrature oscillator signal is supplied. PNP transistors Q94 and Q95 augment the NPN emitter followers. The gm/C stage 214 is similarly buffered by the emitter followers in Q82 and Q83 to produce another quadrature oscillator signal on differential outputs 228 and 230. Although these signals have a quadrature relationship to each other (i.e., "sin/cos") they are not actually the quadrature outputs of the oscillator. The actual quadrature outputs are produced by the Pythagorator after some additional amplification.

The oscillator core 208 further includes two control inputs 232 and 234. The control inputs are shown separately, but could alternatively be combined in another embodiment. A diode-connected transistor is connected between each output of the gm/C stage and the respective control input. For example, the anode of diode-connected transistor Q84 is connected to output 222 and the cathode to the control input 232. Similarly, the anode of diode-connected transistor Q85 is connected to output 220 and the cathode to control 232. Diode-connected transistors Q86 and Q87 are similarly connected between the respective outputs of the gm/C stage 214 and the other control input 234.

The diode-connected transistors Q84–Q87 (also referred to as damping diodes) provide a positive shunt resistance that counteracts the negative shunt resistance of the negative resistance cells. Each control input receives a control current which flows through the diode-connected transistors. As the diode-connected transistors begin to conduct they produce a shunt positive resistance across the shunt negative resistance of the negative resistance cells of the gm/C stage to which they are connected. This shunt positive resistance has the effect of pushing the complex poles back toward the left-hand of the S-plane (LHP) until they reach the imaginary axis, i.e., the shunt positive resistance equals the shunt negative resistance. This control current is generated in response to the amplitude of the quadrature oscillator signals. When the amplitude of these quadrature signals exceed a predetermined level, as determined by the Pythagorator using the trigonometric identity, the control or dampling current is supplied to the control inputs. In contrast, when the amplitude of the quadrature oscillator signals are below the predetermined level no control current is generated by the Pythagorator thereby allowing the regenerative effect of the negative resistance elements to dominate.

The oscillator further includes two bias current outputs 236 and 238 that are connected to the Pythagorator 210 to provide two bias currents thereto. Each output is connected to a collector of respective PNP transistors. These PNP transistors Q88 and Q89 are included in the oscillator so that the bias currents provided to the Pythagorator, from which the control currents are derived, will track the currents through the negative resistance cells. They must track so that the negative and positive shunt resistances can cancel at equilibrium. To accomplish this, the base of transistor Q88 is connected to the base of negative resistance transistors Q90 and Q91 of the gm/C stage 212 so that they share a common base to emitter voltage. The emitter area of Q88 is twice that of either Q90 and Q91 so as to double the current produces thereby for the same voltage. PNP transistor Q89 is similarly connected to negative resistance transistors Q92 and Q93.

The oscillator includes several voltage inputs 240, 242 and 244. The two supply voltage rails VPDM and VTLO are received on inputs 240 and 244, respectively. A bias voltage VTOS is received on input 242. This bias voltage VTOS is applied to the bases of all the NPN current source transistors to establish the current therethrough and also to establish the frequency of oscillation, as described above.

Figure 18:
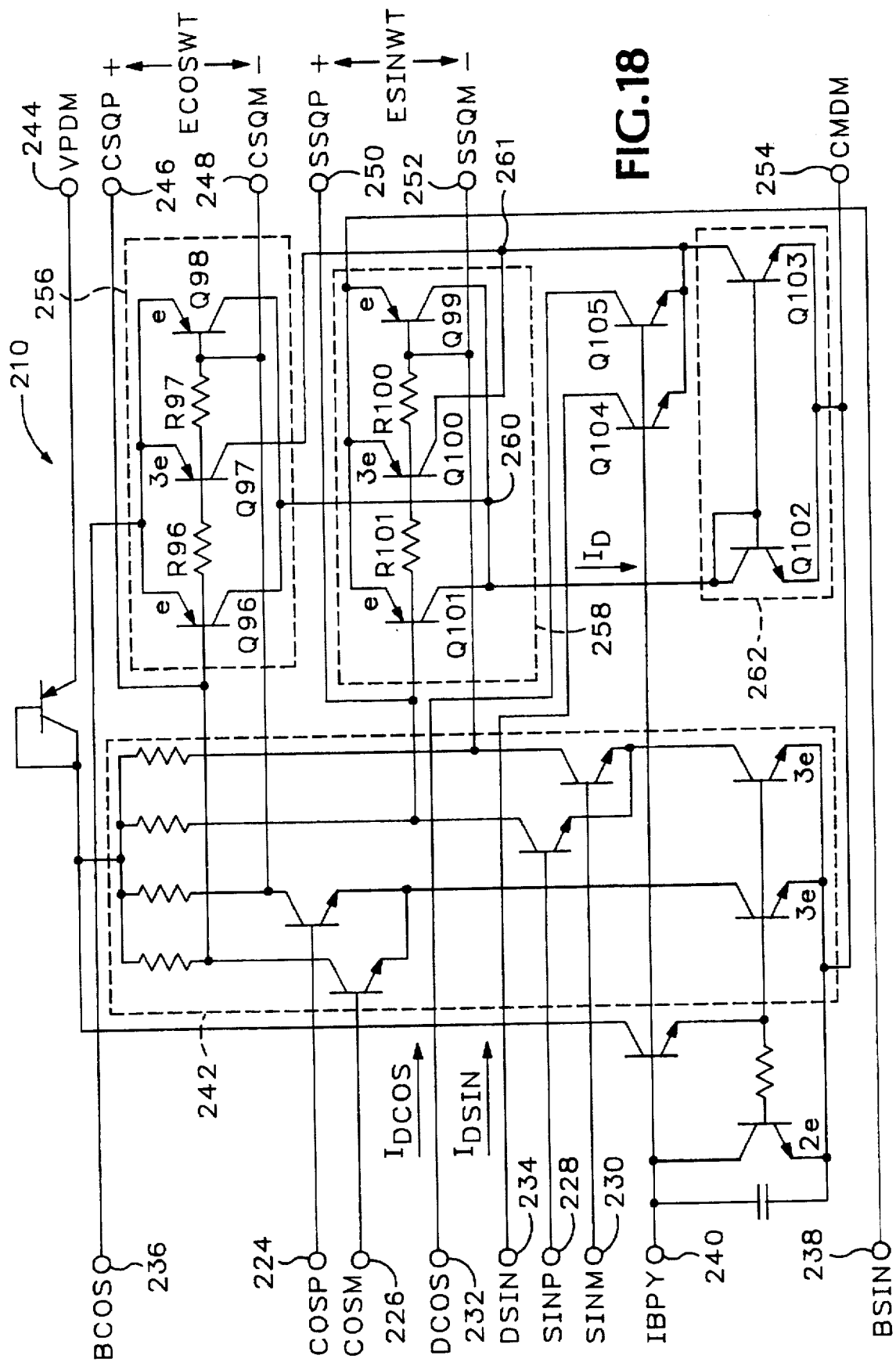
FIG. 18 is a schematic diagram of the amplitude control circuit of FIG. 16.

Referring now to FIG. 18, a schematic diagram of the Pythagorator 210 is shown. Common terminals between the oscillator core and the Pythagorator have common reference numerals between the two schematics. The Pythagorator 210 includes four main components. The first is a gain stage 242 that includes two differential pairs, each having a respective current source transistor, forming a so-called "long tailed pair." Each long tailed pair has a differential pair of inputs formed by the bases of the differential pair of transistors and a pair of differential outputs formed by the collectors of the differential pair. The gain of this stage is set by the values of the resistors and the collectors of the differential pair of transistors, as is known in the art. In the preferred embodiment, the gain stage 242 provides a gain of approximately five. The gain stage 242 receives the two output signals from the oscillator core and amplifies these signals by the predetermined gain of the stage. These amplified signals are the actual quadrature oscillator signals, i.e., Esin⍺t and Ecos⍺t.

Two other main components are the squaring circuits 256 and 258. The squaring circuits each include three PNP transistors arranged in parallel with a separate resistor between the bases of adjacent transistors. The emitters of the three transistors are connected together to form a common emitter node, which for squaring circuit 256 is connected to terminal 236 and for squaring circuit 258 to terminal 238. The collectors of the outer transistors (e.g., Q96 and Q98) are connected together and further connected to a summing node 260, which operates to sum the output currents of the two squaring circuits. The collectors of the two inner transistors Q97 and Q100 are also connected together at node 261. The bases of the two outer transistors (e.g., Q96 and Q98) form a differential input for the respective squaring circuit. This differential input is connected to the differential output of a corresponding differential pair in the gain stage 242 to receive one of the amplified quadrature oscillator signals.

It should be apparent by now that the implementation shown in FIGS. 17 and 18 has eliminated two of the components shown in the block diagram of FIG. 15, i.e., the summing circuit 190 and the difference amplifier 200. The summing circuit is eliminated by connecting the collectors of the outer transistors directly together so that the current outputs of the squaring circuits are summed together at that node to form a single output current $I_D$.

The difference amplifier is eliminated by appropriately sizing the emitter areas of the squaring circuit transistors. As indicated in FIG. 18, the outer transistors have an emitter area equal to e while the middle transistors have an emitter area equal to 3e, i.e., three times that of the outer transistors. Typically, the inner transistor has an emitter area equal to twice that of the outer transistors so that a voltage applied to the squaring circuit that is equal to zero will produce an output current equal to zero as is required by a squaring function. By making the emitter area ratio of the inner transistor to the outer transistors greater than two, the squaring circuits 256 and 258 each produce a non-zero current for an input voltage of zero. This change has the effect of moving the V-to-I curve off the origin. The squaring circuits thus require a non-zero input voltage to produce an output current equal to zero. The emitter area ratio has been chosen so that the input voltage required to produce an output current equal to zero is the desired amplitude of the quadrature oscillator signals Ecosωt and Esinωt. This is, of course, not the actual voltage produced by the quadrature oscillator core because those voltages are amplified by the gain stage 242. The circuit could, however, be designed without the gain stage 242 interposed between the oscillator 208 and the squaring circuits 256 and 258 in which case the required voltage to produce a zero current by the squaring circuits would be that produced by the oscillator.

The output current ID produced at the summing node 260 is provided to a current mirror 262 comprised of diode-connected transistor Q102 and mirror transistor Q103. The current $I_D$ through Q102 is mirrored in Q103 by virtue of the common-based emitter voltages between the two. The collector of transistor Q103 is connected to node 261 as are the emitters of two cascode transistors Q104 and Q105, which are biased by the bias current received at input terminal 240. The collector of cascode transistor Q105 is connected to control terminal 232, which is connected to the cathode of the damping diodes Q84 and Q85 in FIG. 17. Similarly, the collector of cascode transistor Q104 is connected to control terminal 234, which in turn is connected to the cathodes of damping diodes Q86 and Q87 in FIG. 17. These cascode transistors provide the damping or control currents and $I_{DSIN}$ to the shunt damping diodes, which in turn reduce the amplitude of the output signals produced by the respective gm/C stage.

The Pythagorator 210 controls the amplitude of the quadrature oscillator signals with high precision by taking advantage of the trigonometric identity. Even though the shunt negative-resistance cells and the positive shunt diode-connected transistors each individually exhibit nonlinearities (i.e., their V-to-I characteristics, measured separately, are not those of a simple resistor) nevertheless these non-linear impedances precisely cancel when their bias currents are equal, resulting in an essentially infinite shunt resistance. Thus, the two integrator stages become "perfect." In addition, if the integrator stages should exhibit "self-damping"—due to finite output impedance of the gm stages—this is automatically counteracted by a small reduction in the equilibrium current in the shunt positive diode-connected transistors. This technique is particularly well-suited for small signal amplitudes on the order of 30 millivolts. Some of the other amplitude control techniques described above are more well-suited for larger amplitudes on the order of approximately 600 millivolts.

Having described and illustrated the principles of the invention in a preferred embodiment thereof, it should be apparent that the invention can be modified in arrangement and detail without departing from such principles. As will be apparent to those skilled in the art, other types of transistors or technologies can be used in place of those shown. For example, implementations which use field effect transistors (FET) or heterodyne transistors or PNP transistors in place of NPN transistors and vice versa, can be constructed according to the principles herein.

I claim all modifications and variation coming within the spirit and scope of the following claims:

1. An oscillator with precision amplitude control based on a trigonometric identity, the oscillator comprising:

an oscillator having a first signal output for providing a first quadrature signal, a second signal output for providing a second quadrature signal that is in quadrature with the first quadrature signal, and a control input for receiving a control signal, the first and second quadrature signals having an amplitude that is responsive to the control signal;

a first transistor having a base, a collector, and an emitter;

a second transistor having a base, a collector, and an emitter connected directly to the emitter of the first transistor;

a third transistor having a base, a collector connected directly to the collector of the first transistor, and an emitter connected directly to the emitter of the second transistor to form a common emitter node, wherein the bases of the first and third transistors form a first squaring input for receiving the first quadrature signal and the common collectors of the first and third transistors form a first squaring output for providing a first squared signal;

a first resistor connected directly between the base of the first transistor and the base of the second transistor;

a second resistor connected directly between the base of the second transistor and the base of the third transistor;

a second squaring cell having a second squaring input coupled to the second signal output for receiving the second quadrature signal and having a second squaring output for providing a second squared signal that is the square of the second quadrature signal; and a feedback circuit having a first input coupled to the first squaring output for receiving the first squared signal, a second input coupled to the second squaring output for receiving the second squared signal, and an output coupled to the control input of the oscillator for providing the control signal to the oscillator, the control signal being responsive to a sum of the first and second squared signals to control the amplitude of the first and second quadrature signals.

2. An oscillator according to claim 1 wherein the first and third transistors each have a first emitter area (e) and the second transistor has a second emitter area (Ae) so that the first squared signal appearing on the first squaring output has a non-zero value for a zero value of the first quadrature signal.

3. An oscillator according to claim 2 wherein the first and third transistors each have a first emitter area and the second transistor has a second emitter area approximately equal to three times the first emitter area.

4. An oscillator according to claim 1 wherein the feedback circuit includes a current mirror coupled between the inputs of the feedback circuit and the control input.

5. An oscillator according to claim 4 wherein the feedback circuit further includes a cascode transistor interposed between the current mirror and the control input.

6. An oscillator according to claim 1 wherein the oscillator includes:

a first integrator stage having a first differential signal input, a first differential signal output for producing the first quadrature signal thereacross, and a first control input for receiving the control signal, the first quadrature signal having an amplitude that is responsive to the control signal; and a second integrator stage having a second differential signal input coupled to the first differential signal output for receiving the first quadrature signal, a second differential signal output cross-coupled to the first differential signal input for producing a second quadrature signal thereacross, and a second control input for receiving the control signal, the second quadrature signal being in quadrature with the first quadrature signal and having an amplitude that is responsive to the control signal.

7. An oscillator according to claim 6 wherein the first integrator stage includes:

a gm/C stage including a differential pair of transistors having a pair of differential inputs forming the first differential signal input and a pair of differential outputs forming the first differential signal output, the gm/C stage including a capacitor coupled across the differential outputs of the differential pair of transistors, the gm/C stage having a pair of complex conjugate poles that determine the frequency of oscillation and that are a function of the transconductance (gm) of the differential pair and a capacitance (C) of the capacitor; and a damping circuit interposed between the pair of differential outputs of the differential pair of transistors and the control input for receiving the control signal, the damping circuit maintaining the complex conjugate poles on the real axis responsive to the control signal.

8. An oscillator according to claim 7 wherein the damping circuit includes for each integrator stage:

a first diode having an anode coupled to a first one of the differential pair of outputs of the differential pair of transistors and having a cathode coupled to the control input; and a second diode having an anode coupled to a second one of the differential pair of outputs of the differential pair of transistors and having a cathode coupled to the control input.

9. An oscillator according to claim 8 further comprising a gain stage including:

a first amplifier interposed between the first integrator stage and the first squaring input to amplify the first quadrature signal; and a second amplifier interposed between the second integrator stage and the second squaring cell to amplify the second quadrature signal.

10. A method of controlling the amplitude in a quadrature oscillator, the method comprising the steps of:

detecting a first quadrature oscillator signal at a first oscillator output;

detecting a second quadrature oscillator signal at a second oscillator output;

squaring the first quadrature oscillator signal to produce a first squared quadrature oscillator signal;

squaring the second quadrature oscillator signal to produce a second squared quadrature oscillator signal;

summing the first and second squared quadrature oscillator signals to produce a summed signal; and reducing the amplitude of the first and second quadrature oscillator signals responsive to the summed signal to produce a desired amplitude on the first and second quadrature oscillator signals, the step of reducing the amplitude of the first and second quadrature oscillator signals including;

coupling a diode to the first oscillator output;

generating a control current that is responsive to the summed signal; and passing the control current through the diode so as to produce a shunt positive resistance at the first oscillator output.

11. A method of controlling the amplitude in a quadrature oscillator according to claim 10 wherein the step of reducing the amplitude of the first and second quadrature oscillator signals includes:

coupling a second diode to the second oscillator output; and passing the control current through the second diode so as to produce a shunt positive resistance at the second oscillator output.

12. A controlling the amplitude in a quadrature oscillator, the method comprising the steps of:

detecting a first quadrature oscillator signal at a first oscillator output;

detecting a second quadrature oscillator signal at a second oscillator output;

squaring the first quadrature oscillator signal to produce a first squared quadrature oscillator signal, the step of squaring the first quadrature oscillator signal includes generating a non-zero first squared quadrature oscillator signal for a zero first quadrature oscillator signal;

squaring the second quadrature oscillator signal to produce a second squared quadrature oscillator signal;

summing the first and second squared quadrature oscillator signals to produce a summed signal; and reducing the amplitude of the first and second quadrature oscillator signals responsive to the summed signal to produce a desired amplitude on the first and second quadrature oscillator signals.

13. A method of controlling the amplitude in a quadrature oscillator according to claim 12 wherein the step of squaring the second quadrature oscillator signal includes generating a non-zero second squared quadrature oscillator signal for a zero second quadrature oscillator signal.

14. A method of controlling the amplitude in a quadrature oscillator according to claim 13 wherein the steps of generating non-zero first and second squared quadrature oscillator signals for zero first and second quadrature oscillator signals include:

providing a first three transistor squaring circuit;

providing a second three transistor squaring circuit, the three transistors in each squaring circuit including two outer transistors and an inner transistor arranged in parallel, each transistor having an emitter area; and for each squaring circuit, providing an emitter area ratio of the inner transistor emitter area to the outer transistors emitter area equal to greater than 2:1.

15. A method of controlling the amplitude in a quadrature oscillator according to claim 14 wherein the step of detecting a first quadrature oscillator signal includes:

amplifying the first quadrature oscillator signal to produce a first amplified quadrature oscillator signal; and providing the first amplified quadrature oscillator signal to the first squaring circuit.

16. A method of controlling the amplitude in a quadrature oscillator according to claim 14 wherein the step of summing the first and second squared quadrature oscillator signals to produce a summed signal includes:

coupling an output of the first squaring circuit to a summing node; and coupling an output of the second squaring circuit to the summing node.

17. A method of controlling the amplitude in a quadrature oscillator according to claim 16 wherein the step of reducing the amplitude of the first and second quadrature oscillator signals responsive to the summed signal to produce a desired amplitude on the first and second quadrature oscillator signals includes:

detecting a signal produced at the summing node;

mirroring the signal produced on the summing node to produce a mirrored summed signal; and adjusting the amplitude of the first and second quadrature oscillator signals responsive to the mirrored summed signal to produce a desired amplitude on the first and second quadrature oscillator signals.

18. An oscillator comprising:

a first integrator stage having a first pair of input terminals and a first pair of output terminals, the first integrator stage having a first transconductance (gm) stage and a first capacitor coupled across the first pair of output terminals, wherein the transconductance (gm) of the first transconductance stage and the capacitance (C) of the first capacitor produce a 90 degree phase shift between a signal appearing on the first pair of input terminals and a signal appearing on the first pair of output terminals; and a second integrator stage having a second pair of input terminals and a second pair of output terminals, the second integrator stage having a second transconductance (gm) stage and a second capacitor coupled across the second pair of output terminals, wherein the transconductance (gm) of the second transconductance stage and the capacitance (C) of the second capacitor produce a 90 degree phase shift between a signal appearing on the second pair of input terminals and a signal appearing on the second pair of output terminals;

wherein the first pair of output terminals is coupled to the second pair of input terminals and the second pair of output terminals is cross-coupled to the first pair of input terminals such that a signal appearing on the second pair of input terminals is 180 degrees out of phase with a concomitant signal appearing on the first pair of input terminals whereby the oscillator oscillates.

19. An oscillator according to claim 18 wherein the first transconductance stage includes:

a first differential pair of transistors, each transistor having a base, a collector, and an emitter, wherein the bases of the first differential pair form the first pair of input terminals and the collectors of the first differential pair form the first pair of output terminals;

a first common-mode biasing circuit coupled between a supply voltage terminal for receiving a supply voltage and the first pair of output terminals; and a first current source coupled to the emitters of the first differential pair of transistors to bias the first differential pair of transistors and thereby establish the transconductance (gm) of the first integrator stage.

20. An oscillator according to claim 19 wherein the second transconductance stage includes:

a second differential pair of transistors, each transistor having a base, a collector, and an emitter, wherein the bases of the second differential pair form the second pair of input terminals and the collectors of the second differential pair form the second pair of output terminals;

a second common-mode biasing circuit coupled between the supply voltage terminal and the second pair of output terminals; and a second current source coupled to the emitters of the second differential pair of transistors to bias the second differential pair of transistors and thereby establish the transconductance (gm) of the second integrator stage.

21. An oscillator according to claim 20 wherein the first common-mode biasing circuit includes:

a first transistor coupled between the supply voltage terminal and the collector of a first one of the first differential pair of transistors and having a control terminal for receiving a control signal;

a second transistor coupled between the supply voltage terminal and the collector of a second one of the first differential pair of transistors and having a control terminal coupled to the control terminal of the first transistor for receiving the control signal; and a third transistor coupled between the emitters of the second differential pair of transistors and the control terminals of the first and second transistors for providing the control signal thereto.

22. An oscillator according to claim 21 wherein the first common-mode biasing circuit further includes a first diode-connected transistor interposed between the supply voltage terminal and the first and second transistors, wherein the first diode-connected transistor is of a first type of transistor and the first and second transistors are of a second type of transistor.

23. An oscillator according to claim 22 wherein the first diode-connected transistor is an NPN transistor and the first and second transistors are PNP transistors.

24. An oscillator according to claim 18 further comprising:

a first amplitude-control diode coupled between a first one of the first pair of output terminals of the first integrator stage and a first supply voltage terminal for receiving a first supply voltage; and a second amplitude-control diode coupled between a second one of the first pair of output terminals of the first integrator stage and the first supply voltage terminal, wherein the first and second amplitude-control diodes control an amplitude of the signal appearing across the first pair of output terminals.

25. An oscillator according to claim 24 further comprising a first diode-connected transistor interposed between the first supply voltage terminal and the first and second amplitude-control diodes.

26. An oscillator according to claim 25 wherein the first and second amplitude-control diodes and the first-diode connected transistor are of a first type of transistor.

27. An oscillator according to claim 25 wherein the first and second amplitude-control transistors and the first-diode connected transistor are PNP transistors.

28. An oscillator according to claim 18 further comprising:

a first start-up circuit coupled to the first pair of output terminals; and a second start-up circuit coupled to the second pair of output terminals.

29. An oscillator according to claim 28 wherein the first start-up circuit includes a negative impedance circuit whose impedance compensates for a positive impedance of the second integrator stage as seen looking into the second pair of input terminals.

30. An oscillator according to claim 28 wherein the first start-up circuit includes:

a first transistor having a base, an emitter, and a collector coupled to a first one of the first pair of output terminals;

a second transistor having a base coupled to the collector of the first transistor, an emitter coupled to the emitter of the first transistor, and a collector coupled to a second one of the first pair of output terminals; and a current source coupled to the emitters of the first and second transistors.

31. An oscillator according to claim 30 further comprising a variable current source coupled to the emitters of the first and second transistors to vary the impedance of the first start-up circuit.

32. An oscillator according to claim 31 wherein the variable current source includes a current mirror.

33. An oscillator comprising:

a first integrator stage having a first pair of input terminals and a first pair of output terminals, wherein the first integrator stage produces a 90 degree phase shift between a signal appearing on the first pair of input terminals and a signal appearing on the first pair of output terminals;

a second integrator stage having a second pair of input terminals and a second pair of output terminals, wherein the second integrator stage produces a 90 degree phase shift between a signal appearing on the second pair of input terminals and a signal appearing on the second pair of output terminals, the first pair of output terminals being coupled to the second pair of input terminals and the second pair of output terminals being cross-coupled to the first pair of input terminals;

a first negative-resistance start-up circuit coupled to the first pair of output terminals that compensates for a positive resistance of the second integrator stage as seen looking into the second pair of input terminals; and a second negative-resistance start-up circuit coupled to the second pair of output terminals that compensates for a positive resistance of the first integrator stage as seen looking into the first pair of input terminals, whereby the first and second negative-resistance start-up circuits ensure oscillation of the oscillator.

34. An oscillator according to claim 33 wherein the first negative-resistance start-up circuit includes:

a first transistor having a base, an emitter, and a collector coupled to a first one of the first pair of output terminals;

a second transistor having a base coupled to the collector of the first transistor, an emitter coupled to the emitter of the first transistor, and a collector coupled to a second one of the first pair of output terminals; and a current source coupled to the emitters of the first and second transistors to provide a bias current to the first and second transistors.

35. An oscillator according to claim 34 further comprising a first limiter amplifier having a bias current source that provides a bias current to the limiter amplifier, and having a pair of inputs coupled to the first pair of output terminals for receiving a first output signal generated thereacross and a pair of output terminals for providing a square-wave representation of the first output signal, the limiter amplifier having an effective resistance ($R_{BS}$) as seen at the limiter amplifier's pair of inputs that is a function of the bias current.

36. An oscillator according to claim 35 further comprising:

a current detector circuit coupled to the first limiter amplifier for sensing the bias current; and a current bias circuit coupled between the current detector circuit and the current source of the first negative-resistance start-up circuit so as to vary the current provided by the current source of the first negative-resistance start-up circuit responsive to the bias current sensed by the current sense circuit to produce a change in the negative resistance of the first negative-resistance start-up circuit to compensate for the effective resistance ($R_{BS}$) of the first limiter amplifier.

37. An oscillator according to claim 36 wherein the current detector circuit includes:

a first current source in parallel with the bias current source of the first limiter amplifier;

a cascade transistor coupled in series with the first current source to provide a beta sample of the current in the first current source; and a first current mirror coupled to the cascade transistor to receive the beta sample and to generate a mirrored beta sample.

38. An oscillator according to claim 37 wherein the current bias circuit includes a second current mirror coupled to the first current mirror to receive the mirrored beta sample and coupled to the emitters of the first and second transistors of the first negative-resistance start-up circuit so as to provide an additional bias current thereto, wherein the additional bias current alters the negative resistance of the first negative-resistance start-up circuit to compensate for the effective resistance of the first limiter amplifier.

\* \* \* \* \*

UNITED STATES PATENT AND TRADEMARK OFFICE
CERTIFICATE OF CORRECTION

PATENT NO.    : 5,714,911
DATED         : February 3, 1998
INVENTOR(S)   : Barrie Gilbert It is certified that error appears in the above-identified patent and that said Letters Patent is hereby corrected as shown below:

Column 6,
Line 33, "magnatude" should read -- magnitude --.

Column 8,
Line 39, "multi-tanhn-tuplet" should read -- multi-tanh n-tuplet --.

Column 9,
Line 22, "current IT" should read -- current $I_T$ --.

Column 12,
Lines 4-5, delete the first occurrence of "as a result of the amplitude control".

Column 14,
Line 46, "circuit 228" should read -- circuit 258 --.

Column 15,
Line 25, "output current ID" should read -- output current $I_D$ --.
Line 39, "currents and $I_{DSIN}$" should read -- currents $I_{DCOS}$ and $I_{DSIN}$ --.

Column 17,
Line 47, "input" should read -- cell --.
Line 56, "a second quadrature" should read -- a first quadrature --.

Column 18,
Line 19, "A controlling" should read -- method of controlling --
Line 23, "a second quadrature" should read -- a first quadrature --.

Signed and Sealed this

Eighteenth Day of March, 2003

JAMES E. ROGAN
*Director of the United States Patent and Trademark Office*